(12) United States Patent
Ahmed et al.

(10) Patent No.: US 9,634,615 B1
(45) Date of Patent: Apr. 25, 2017

(54) MULTI-BAND DOHERTY AMPLIFIER DEVICE AND METHOD THEREFOR

(71) Applicant: FREESCALE SEMICONDUCTOR, INC., Austin, TX (US)

(72) Inventors: Abdulrhman M. S. Ahmed, Gilbert, AZ (US); Ramanujam Srinidhi Embar, Gilbert, AZ (US); Yu-Ting D. Wu, Gilbert, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/064,058

(22) Filed: Mar. 8, 2016

(51) Int. Cl.
| | |
|---|---|
| *H03F 1/00* | (2006.01) |
| *H03F 3/19* | (2006.01) |
| *H03F 1/02* | (2006.01) |
| *H03F 3/21* | (2006.01) |
| *H03F 3/24* | (2006.01) |

(52) U.S. Cl.
CPC ............ *H03F 1/0288* (2013.01); *H03F 3/19* (2013.01); *H03F 3/211* (2013.01); *H03F 3/245* (2013.01); *H03F 2200/111* (2013.01); *H03F 2200/225* (2013.01); *H03F 2200/451* (2013.01); *H03F 2203/21103* (2013.01); *H03F 2203/21139* (2013.01); *H03F 2203/21142* (2013.01)

(58) Field of Classification Search
CPC .................................... H03F 1/00; H03F 3/19
USPC ................................ 330/295, 124 R, 53, 127
See application file for complete search history.

(56) References Cited

U.S. PATENT DOCUMENTS

| | | | |
|---|---|---|---|
| 8,502,599 B2 | 8/2013 | Conradi | |
| 8,514,007 B1 | 8/2013 | Ahmed et al. | |
| 8,593,219 B1* | 11/2013 | Root | H03F 1/0288 330/124 R |
| 8,824,978 B2* | 9/2014 | Briffa | H03F 1/32 330/124 R |
| 2011/0279178 A1* | 11/2011 | Outaleb | H03F 1/0288 330/124 R |
| 2012/0092074 A1* | 4/2012 | Yanduru | H03F 1/0288 330/295 |
| 2014/0253248 A1 | 9/2014 | Ahmed et al. | |

(Continued)

FOREIGN PATENT DOCUMENTS

EP 2159912 A1 3/2010

OTHER PUBLICATIONS

Colantonio et al, "Design of a Dual-Band GaN Doherty Amplifier", 18th International Conference Microw. Radar Wireless Communication, Jun. 2010, 4 pages.

*Primary Examiner* — Patricia T Nguyen

(57) ABSTRACT

A Doherty amplifier device operable over multiple frequency bands includes a controller that, in some embodiments, is configured to output a carrier bias signal to a first amplifier and a peaking bias signal to a second amplifier as part of a first operating configuration associated with a first frequency band, and output the peaking bias signal to the second amplifier and the carrier bias signal to a third amplifier as part of a second operating configuration associated with a second frequency band. In some embodiments, the controller is configured to select an impedance inverter configuration associated with a respective frequency band. At least one impedance inverter configuration includes a compound impedance inverter including two or more impedance inverters coupled in series with at least one node between the two or more impedance inverters coupled to an output of a third amplifier.

20 Claims, 10 Drawing Sheets

(56) References Cited

U.S. PATENT DOCUMENTS

| | | | | |
|---|---|---|---|---|
| 2014/0375389 A1* | 12/2014 | Jeon | ............... | H03F 1/0288 330/295 |
| 2015/0091653 A1* | 4/2015 | Kobayashi | ............ | H03F 1/0288 330/295 |
| 2016/0248384 A1* | 8/2016 | Lehtola | ................ | H03F 1/0288 |

* cited by examiner

MULTI-BAND DOHERTY AMPLIFIER DEVICE AND METHOD THEREFOR

BACKGROUND

Field

This disclosure relates generally to radio frequency (RF) power amplifiers (PAs), and more specifically, to a Doherty amplifier device capable of operation in multiple frequency bands.

Related Art

The conventional Doherty amplifier is extensively used in wireless communication, as it provides high efficiency for modern modulation techniques. A typical conventional Doherty amplifier is capable of operating over only a single frequency band, where the output combiner of the conventional Doherty amplifier is tuned to the single frequency band. Such design constraints of the conventional Doherty amplifier make implementation of a device having an extended operational frequency range overly burdensome.

BRIEF DESCRIPTION OF THE DRAWINGS

The present invention may be better understood, and its numerous objects, features, and advantages made apparent to those skilled in the art by referencing the accompanying drawings.

The present invention is illustrated by way of example and is not limited by the accompanying figures, in which like references indicate similar elements, unless otherwise noted. Elements in the figures are illustrated for simplicity and clarity and have not necessarily been drawn to scale.

DETAILED DESCRIPTION

Figure 1:
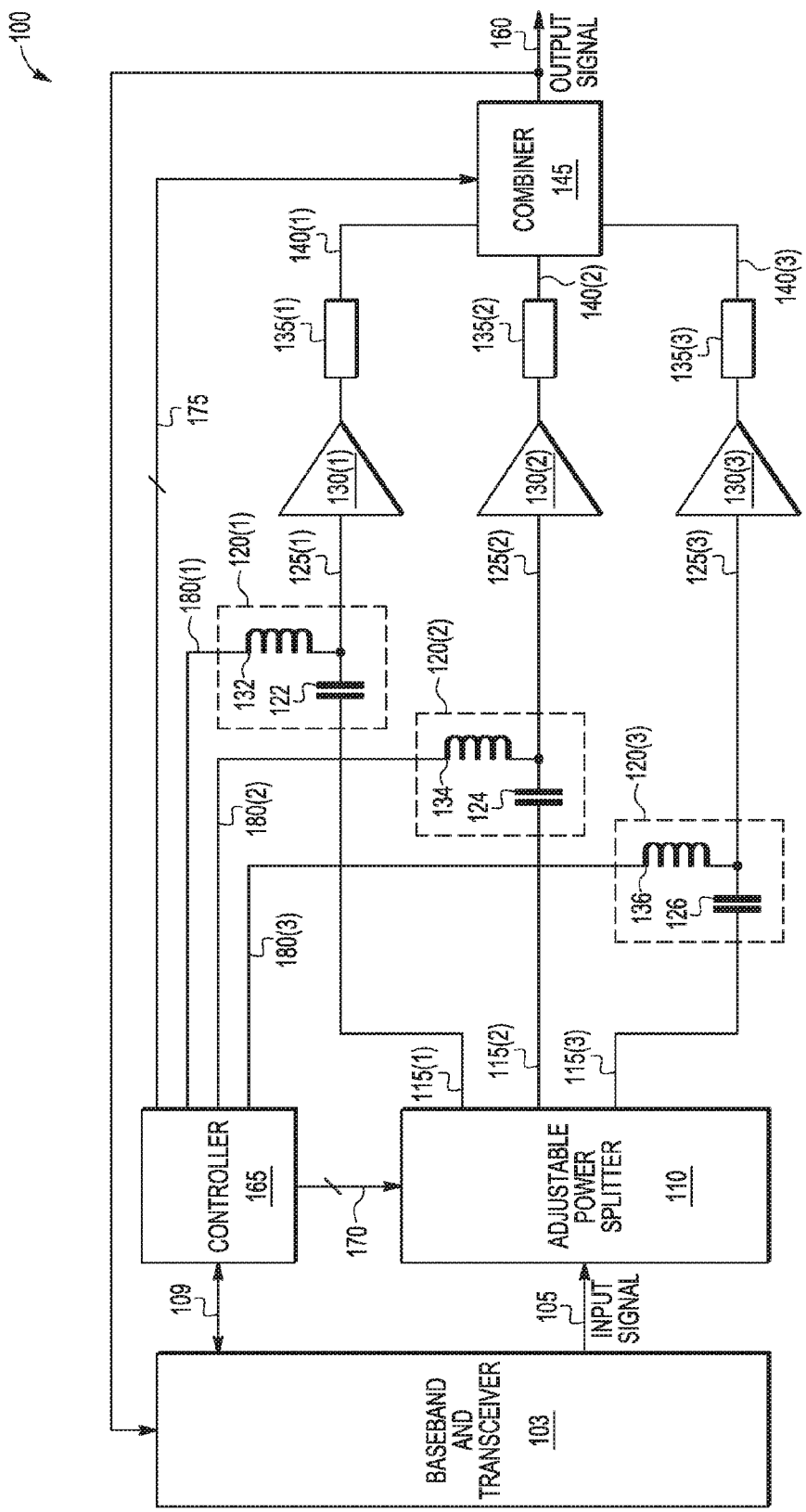
FIG. 1 illustrates a block diagram depicting an example multi-band Doherty amplifier device in which the disclosure is implemented, according to some embodiments.

The following sets forth a detailed description of various embodiments intended to be illustrative of the invention and should not be taken to be limiting.

Overview

Previous attempts at extending the operational frequency range of an amplifier device utilizing conventional Doherty amplifiers have often resulted in devices that include an unwieldly number of amplifiers. Since a conventional Doherty amplifier has a conventional output combiner tuned to the particular frequency band over which the conventional Doherty amplifier operates, a dedicated conventional Doherty amplifier (which includes a dedicated carrier amplifier and a dedicated peaking amplifier) is usually required for each different frequency band.

The present disclosure provides a Doherty amplifier device that is operable over multiple frequency bands (also referred to herein as a multi-band Doherty amplifier device). The multi-band Doherty amplifier device is configured to determine a frequency band within which a frequency of an input signal falls, where the determined frequency band is one of a number of frequency bands configurable on the multi-band Doherty amplifier device. The multi-band Doherty amplifier device is designed to be operable over a set of three or more frequency bands, each frequency band having a different center frequency. One or more (lower) center frequencies of the set have a quarter wavelength ($\lambda/4$) approximately equal to (or proportional to) a combination of quarter wavelengths of two or more (higher) center frequencies of the set, in some embodiments. As used herein, the terms "approximately" and "about" mean within 10 percent, plus or minus, of a quantity. Alternatively, the terms "approximately" and "about" mean within 5 percent, plus or minus, of a quantity.

As used herein, a "frequency band" means a range or section of frequencies of the spectrum of radio communication frequencies, where the frequency band is delimited by an upper and lower frequency and characterized as having a center frequency between the upper and lower frequencies that is approximately equally spaced from each of the upper and lower frequencies, in which the multi-band Doherty amplifier device is operable. Each frequency band is associated with an operating configuration for the multi-band Doherty amplifier device, which can be automatically implemented in the multi-band Doherty amplifier device upon determination of the frequency band in which the input signal frequency falls. Each operating configuration includes selection of an appropriate impedance inverter configuration for the associated frequency band, where the appropriate impedance inverter configuration includes one or more impedance inverters that are approximately tuned to a center frequency of the associated frequency band. For example, one operating configuration may select a single impedance inverter that is approximately tuned to a center frequency of one frequency band (e.g., the single impedance inverter provides a phase shift of approximately 90 degrees for signals within the frequency band), while another operating configuration may select two or more impedance inverters coupled in series that individually are tuned to a respective center frequency of two or more frequency bands, and in combination are approximately tuned to a center frequency of a frequency band lower than the two or more frequency bands (e.g., together, the two or more impedance inverters provide a phase shift of approximately 90 degrees for signals within the lower frequency band).

Each operating configuration also includes activation of a pair of amplifiers coupled on either side of the appropriate impedance inverter configuration, in some embodiments, with one operating as a carrier amplifier and the other operating as a peaking amplifier. In order to minimize the number of amplifiers implemented in the multi-band Doherty amplifier device, each amplifier in the multi-band Doherty amplifier device is configurable to be operated as either a carrier amplifier or as a peaking amplifier by changing the bias signal provided to that amplifier, depending upon which frequency band is presently configured on the multi-band Doherty amplifier device. The remaining amplifiers not coupled to the appropriate impedance inverter configuration are deactivated. Each operating configuration is also configured to provide a pair of signals based on the input signal to the pair of amplifiers, where the pair of signals have a phase shifted relationship to one another by approximately 90 degrees, and where the outputs of the pair of amplifiers are combined in phase by utilizing the appropriate impedance inverter configuration.

Example Embodiments

FIG. 1 illustrates a block diagram depicting an example multi-band Doherty amplifier device 100 in which the disclosure is implemented. Multi-band Doherty amplifier device 100 is a radio frequency (RF) amplifier device that may be implemented as part of a transmitter, a receiver, or a transceiver, which functionality is represented by baseband and transceiver module 103. Embodiments of multi-band Doherty amplifier device 100 (or simply device 100) may include an adjustable power splitter 110, input matching networks 120(1)-(3), amplifier gain elements 130(1)-(3), output matching networks 135(1)-(3), a combiner circuit 145, and a controller circuit 165. These components are further discussed below.

Device 100 is configured to receive an RF signal (e.g., an amplitude-modulated signal) from baseband and transceiver module 103 as an input signal 105 at adjustable power splitter 110, which is further discussed below. Device 100 is also configured to receive the RF input signal 105 over signal bus 109 at controller circuit 165. Controller circuit 165 is also configured to exchange information with baseband and transceiver module 103 over signal bus 109. Signal bus 109 may also include a serial peripheral interface (SPI) to provide data between module 103 and controller 165, where the SPI includes a data in, data out, clock signal, and chip select lines. Module 130 is also configured to receive feedback from output signal node 160. In other embodiments, the controller 165 may receive the RF input signal 105, may communicate with the baseband and transceiver module 103 over different types of communication structures than signal bus 109 and an SPI, or both.

Controller circuit 165 includes logic that is configured to analyze input signal 105 to determine, and automatically implement, an appropriate operating configuration for device 100. For example, in response to receipt of input signal 105, controller circuit 165 determines whether input signal 105 is characterized by a frequency that falls within one of a number of frequency bands (such as within a first frequency band, a second frequency band, or a third frequency band), where device 100 has a different operating configuration associated with each band. For example, but not by way of limitation, the frequency bands may include frequency bands each with center frequencies located between 700 megahertz (MHz) and 4 gigahertz (GHz), although the embodiments may be used in systems that support operation in frequency bands with lower and higher center frequencies, as well. The appropriate operating configuration configures device 100 for efficient amplification of signals within the determined frequency band. Controller circuit 165 is also configured to output a number of control signals and bias signals (or bias circuit control signals) to implement the operating configuration associated with the determined frequency band, as further discussed below. An example process for operating device 100 is further discussed below in connection with FIG. 6, with example operating configurations of device 100 further discussed below in connection with FIGS. 3-5. Another embodiment of device 100 that is configurable for more than three frequency bands is further discussed below in connection with FIG. 7.

Each operating configuration includes activation of two amplifier gain elements 130 and deactivation of the remaining amplifier gain elements 130, where the amplifier gain elements 130(1)-(3) are configured according to bias signals received from controller circuit 165. Each amplifier gain element 130 is an electrical device that is configured to receive a signal and output an amplified version of the signal (e.g., output a signal having greater power than the signal received by the amplifier gain element). In some embodiments, each amplifier gain element 130 is implemented using one or more transistors. In embodiments where amplifier gain elements are implemented using transistors, an input of the amplifier gain element may be a gate of the transistor, and an output of the amplifier gain element may be a source or drain of the transistor.

Controller circuit 165 has a bias signal line 180(1)-(3) coupled to a respective input of each amplifier gain element 130(1)-(3) via input matching networks 120(1)-(3). Bias signal line 180(1) is coupled to a first terminal of inductor 132 of input matching network 120(1). Inductor 132 has a second terminal coupled to the input node 125(1) of amplifier gain element 130(1). Bias signal line 180(2) is coupled to a first terminal of inductor 134 of input matching network 120(2). Inductor 134 has a second terminal coupled to the input node 125(2) of amplifier gain element 130(2). Bias signal line 180(3) is coupled to a first terminal of inductor 136 of input matching network 120(3). Inductor 136 has a second terminal coupled to the input node 125(3) of amplifier gain element 130(3).

Each amplifier gain element 130 is configured to be operated in one of a number of different modes by receiving a bias signal at the input of the amplifier gain element (also referred to as a receiving amplifier gain element or simply receiving amplifier) from controller circuit 165, where the bias signal places the receiving amplifier gain element in one of the different modes according to the operating configuration. For example, one type of bias signal (also referred to as a carrier bias signal) applies a bias voltage at the input of a receiving amplifier gain element to configure the receiving amplifier gain element to operate in Class AB mode (also referred to as a carrier mode), where the receiving amplifier gain element is configured to conduct between 180 to 360 degrees (or one half up to one full cycle) of the input signal. An amplifier gain element operating in carrier mode may also be referred to as a carrier amplifier. Another type of bias signal (also referred to as a peaking bias signal) applies another bias voltage at the input of the receiving amplifier gain element to configure the receiving amplifier gain element to operate in Class C mode (also referred to as a peaking mode), where the receiving amplifier gain element is configured to conduct between 90 to 180 degrees (or one quarter up to one half cycle) of the input signal. An amplifier gain element operating in peaking mode may also be referred to as a peaking amplifier. The carrier amplifier is biased such that it provides amplification of signals below a threshold level, while the peaking amplifier is biased such that it provides amplification of signals above the threshold level to its peak envelope power. In other words, the carrier amplifier provides amplification for lower level signals and both the carrier and peaking amplifiers provide amplification for high level signals. A third type of bias signal applies another bias voltage (also referred to as a deactivation bias signal) at the input of the receiving amplifier gain element to configured the receiving amplifier gain element to operate in a deactivated mode and not conduct at all (e.g., to remain off). As used herein, activation of an amplifier gain element includes providing a carrier bias signal or a peaking bias signal to the amplifier gain element, while deactivation of an amplifier gain element includes providing a deactivation bias signal to the amplifier gain element.

Each operating configuration also includes configuring combiner circuit 145 to select an appropriate impedance inverter configuration for the determined frequency band. A number of impedance inverter configurations are configurable on combiner circuit 145, where each impedance inverter configuration is associated with a respective frequency band and is tuned to approximately the center frequency of the respective frequency band. Combiner circuit 145 is configured to select an impedance inverter configuration from a number of impedance inverters within combiner circuit 145, according to the operating configuration implemented by controller circuit 165. An impedance inverter is an electrical component or circuit that is configured to invert impedance, where the impedance measured at an input terminal of the impedance inverter is the inverse of the impedance measured at an output terminal of the impedance inverter. Combiner circuit 145 includes a number of switches that couple the terminals of the impedance inverters to outputs of amplifier gain elements 130(1)-(3), where the switches receive control signals from controller circuit 165. An impedance inverter configuration is selected by closing (or activating) ones of the switches and opening (or deactivating) other switches in order to complete the path from an output of one of the pair of activated amplifier gain elements 130 through the selected one or more impedance inverters to the output of the other of the pair of activated amplifier gain elements 130.

A selected impedance inverter configuration may include a single impedance inverter or may include a compound impedance inverter configuration that includes two or more single impedance inverters coupled in series. The selected impedance inverter configuration provides a phase shift of approximately 90 degrees for signals whose frequency is within the respective frequency band. Each impedance inverter configuration inverts impedance most accurately at the center frequency of the respective frequency band and less accurately (but within an acceptable tolerance) for frequencies further from the center frequency within the respective frequency band. A selected impedance inverter configuration is coupled between the outputs of the activated amplifier gain elements in order to combine the output signals from the activated amplifier gain elements in phase to produce a single output signal on output signal node 160. Combiner circuit 145 is further discussed below in connection with FIG. 2.

Each operating configuration also includes configuring adjustable power splitter 110 to drive appropriate RF signals to the activated amplifier gain elements 130 (e.g., to respective inputs of the pair of activated amplifier gain elements 130). Adjustable power splitter 110 is configured to divide or split input signal 105 into two signals that are phase shifted from one another (e.g., one signal leads or lags the other signal by some phase angle). The phase shift introduced into the two signals is selected according to a control signal (one of control signals 170) received from controller circuit 165 as part of the operating configuration implemented by controller circuit 165, where the operating configuration configures device 100 to operate within the determined frequency band. The selected phase shift is associated with the determined frequency band. In some embodiments, the phase shift is a fixed phase shift. For example, adjustable power splitter 110 is configured to achieve an approximately 90 degree phase shift between the two signals output by the adjustable power splitter 110, where the phase shift depends on which of a number of different frequency bands the device 100 currently is configured to support. Each approximate 90 degree phase shift respectively corresponds to ¼ of the wavelength (λ) of each center frequency of the different frequency bands.

In other embodiments, the phase shift is an adjustable phase shift selected from a number of phase shift states, with each state providing a different amount of phase shift. In some embodiments, both a fixed phase shift and an adjustable phase shift is introduced to one or both signals. In some embodiments, a phase shift is introduced to one signal (e.g., approximately 90 degrees of phase angle is introduced to one signal). In other embodiments, a phase shift is added to both signals (e.g., approximately positive 45 degrees of phase angle is introduced to one signal, while approximately negative 45 degrees of phase angle is introduced to the other signal, although other phase shift combinations may be used to achieve approximately 90 degrees of phase shift difference between the signals). In some embodiments, adjustable power splitter 110 may be implemented using planar transmission lines, lumped elements (such as a pi network, T-network, or other network utilizing capacitive and inductive elements), co-axial transmission lines, or any other form of transmission line or a combination of lumped elements and planar elements.

In some embodiments, adjustable power splitter 110 is also configured to provide the two signals with approximately equal power (e.g., the two signals are each 3 dB less than the original input signal 105), although adjustable power splitter 110 alternatively may provide unequal power output signals in other embodiments. In some embodiments, adjustable power splitter 110 is also configured to adjust the amplitude of either or both of the two signals, according to another control signal (one of control signals 170) received from controller circuit 165 as part of the operating configuration. In some embodiments, adjustable power splitter 110 is also configured to adjust attenuation of either or both of the two signals, according to another control signal (one of control signals 170) received from controller circuit 165 as part of the operating configuration. In other embodiments, adjustable power splitter 110 may be configured to provide the two signals with unequal power or non-identical attenuation, according to control signals 170 received from controller circuit 165.

In embodiments discussed herein, adjustable power splitter 110 outputs a pair of signals based on the input signal 105, where the pair of signals have approximately equal power and have a phase shifted relationship. The pair of signals are referred to herein as a main signal and a shifted signal, where the shifted signal is phase shifted from the main signal by approximately 90 degrees Adjustable power splitter 110 also includes a selection circuit that is configured to drive a first one of the pair of power splitter output signals on one of paths 115(1)-(3) and drive a second one of the pair of power splitter output signals on another one of paths 115(1)-(3), according to the operating configuration implemented by controller circuit 165. The selection circuit utilized in adjustable power splitter 110 is further discussed below in connection with FIG. 11.

Figure 11:
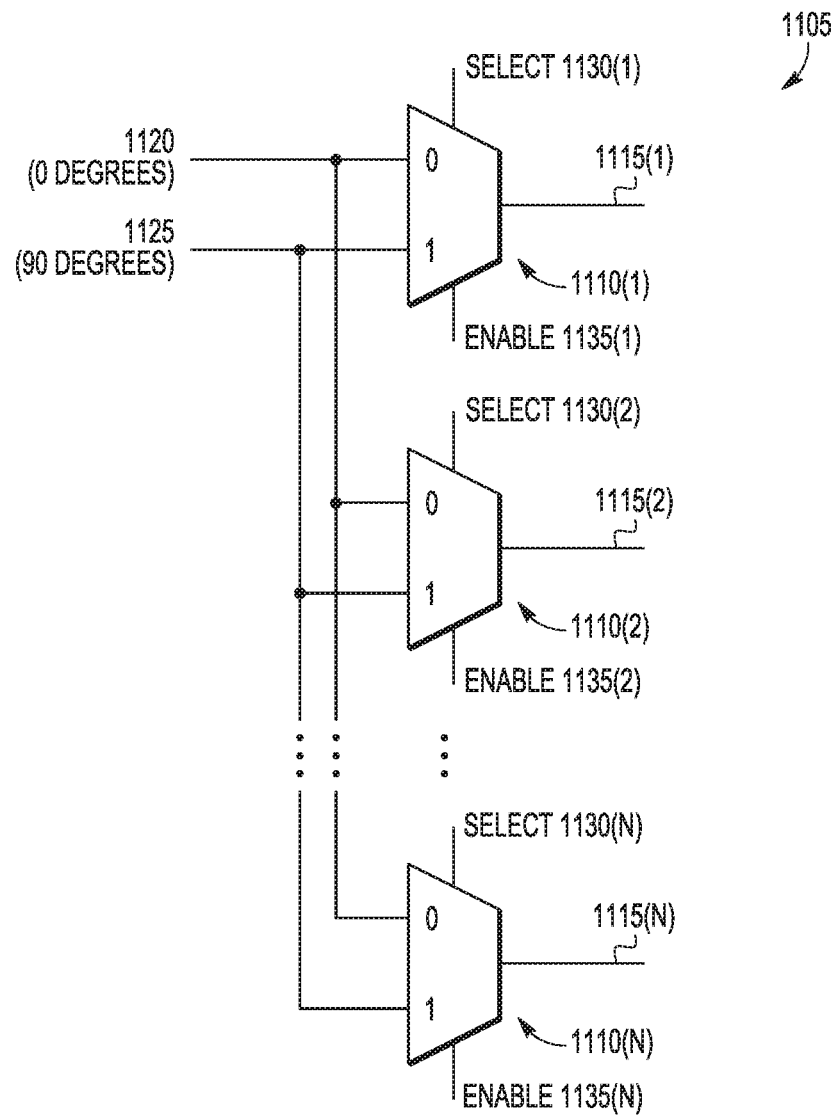
FIG. 11 illustrates a block diagram depicting an example selection circuit utilized in a multi-band Doherty amplifier device like that shown in FIG. 1 and FIG. 7, according to some embodiments.

FIG. 11 illustrates a block diagram depicting an example selection circuit 1105 utilized in a multi-band Doherty amplifier device, like device 100 of FIG. 1. Selection circuit 1105 includes an N number of multiplexers 1110(1)-(N) or other suitable selection circuitry. Each multiplexer has an output 1115 coupled to a respective signal conduction path 115 of device 100. For example, an embodiment of selection circuit 1105 utilized in device 100 may have three multiplexers 1110(1)-(3), each having an output 1115(1) coupled to a respective one of paths 115(1)-(3), where output 1115 (N) is coupled to path 115(3). In an embodiment, each multiplexer 1110 receives a first input signal 1120 (e.g., a main signal) and a shifted second signal 1125 (e.g., a shifted signal), where the first and second input signals 1120 and 1125 may be about 90 degrees out of phase with respect to each other. In the embodiment shown, the signals 1120 and 1125 have a phase shift relationship of approximately 90 degrees, but other phase shifts may be implemented in other embodiments. Each multiplexer 1110 also receives a select signal 1130 and an enable signal 1135 from controller circuit 165, also shown as control signals 170 in FIG. 1. Controller circuit 165 is configured to enable the multiplexers 1110 that are coupled to the activated amplifier gain elements 130 and select the appropriate signal to drive to the activated amplifier gain elements 130, according to the operating configuration. For example, a main signal 1120 is output on a conduction path coupled to the carrier amplifier, which is also referred to a carrier conduction path, while a shifted signal is output on a conduction path coupled to the peaking amplifier, which is also referred to as a peaking conduction path.

Referring back to FIG. 1, each output of adjustable power splitter 110 (or path 115(1)-(3)) is coupled to a respective input of the amplifier gain elements 130(1)-(3) via input matching network 120(1)-(3), which includes passive elements such as capacitive elements, inductive elements, and resistive elements (e.g., an L-network, a pi-network, T-network, or other network utilizing capacitive and inductive elements). Each input matching network 120(1)-(3) is configured to transform impedance between an output of adjustable power splitter 110 and the respective amplifier gain element 130(1)-(3). In the embodiment shown, path 115(1) is coupled to a first terminal of capacitor 122 of input matching network 120(1). Capacitor 122 has a second terminal coupled to an input node 125(1) of amplifier gain element 130(1). Path 115(2) is coupled to a first terminal of capacitor 124 of input matching network 120(2). Capacitor 124 has a second terminal coupled to input node 125(2) of amplifier gain element 130(2). Path 115(3) is coupled to a first terminal of capacitor 126 of input matching network 120(3). Capacitor 126 has a second terminal coupled to an input node 125(3) of amplifier gain element 130(3).

In some embodiments, each amplifier gain element 130 (1)-(3) is coupled to a respective output matching network 135(1)-(3), which includes passive elements such as capacitive elements, inductive elements, and resistive elements (e.g., an L-network, a pi network, T-network, or other network utilizing capacitive and inductive elements). Each output matching network 135(1)-(3) is configured to transform impedance between the respective output of amplifier gain element 130(1)-(3) and combiner circuit 145. An output of amplifier gain element 130(1) is coupled to an input terminal of output matching network 135(1), and an output terminal of output matching network 135(1) is coupled to an input node 140(1) of combiner circuit 145. An output of amplifier gain element 130(2) is coupled to an input terminal of output matching network 135(2), and an output terminal of output matching network 135(2) is coupled to an input node 140(2) of combiner circuit 145. An output of amplifier gain element 130(3) is coupled to an input terminal of output matching network 135(3), and an output terminal of output matching network 135(3) is coupled to input node 140(3) of combiner circuit 145.

In other embodiments, an output of each amplifier gain element 130(1)-(3) is coupled to a respective input node 140(1)-(3) of combiner circuit 145. Nodes 140(1)-(3) are also referred to as intermediate signal nodes 140(1)-(3). Since each of intermediate signal nodes 140(1)-(3) is coupled to a respective output of amplifier gain elements 130(1)-(3), intermediate signal nodes 140(1)-(3) may also be characterized herein as output nodes of amplifier gain elements 130(1)-(3).

It is noted that since each amplifier gain element 130 may be activated in two or more operating configurations (e.g., as a carrier amplifier for one operating configuration associated with one frequency band or as a peaking amplifier for another operating configuration associated with another frequency band), the input and output matching networks 120 and 135 for that amplifier gain element 130 should be designed to cover operation in the frequency bands associated with the two or more operating configurations. In some embodiments, the input and output matching networks 120 and 135 include one or more filters implementing multiple sections to achieve a wide bandwidth that includes the frequency bands experienced by the coupled amplifier gain element (e.g., a binomial multi-section matching network). The specific configuration of the input and output matching networks 120 and 135 will depend on operating impedances and the frequency bands selected for the amplifier gain element 130, which can be determined experimentally by practitioners without undue experimentation.

Figure 2:
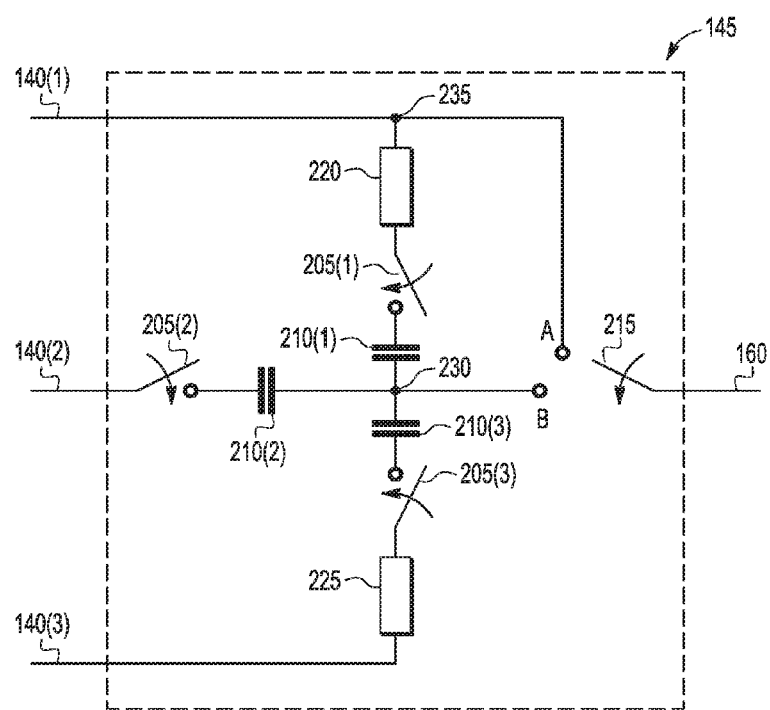
FIG. 2 illustrates a block diagram depicting an example combiner circuit utilized in the multi-band Doherty amplifier device of FIG. 1, according to some embodiments.

FIG. 2 illustrates a block diagram depicting an example combiner circuit 145 utilized in the multi-band Doherty amplifier device of FIG. 1. Combiner circuit 145 includes intermediate signal nodes 140(1)-(3), path switches 205(1)-(3), capacitors 210(1)-(3), output selector 215, impedance inverters 220 and 225, and output signal node 160. Operation of combiner circuit 145 is further discussed below in connection with FIG. 6.

In some embodiments, switches 205(1)-(3) and selector 215 may be implemented using one or more transistors, such as n-channel or p-channel transistors, or other suitable switching devices. Control signals 175 provided by controller circuit 165 to combiner circuit 145 includes a number of switch control signals, each coupled to a respective one of switches 205(1)-(3) at its control terminal. The switch control signals are each configured to open or close the respective switch, where closing the switch makes it conductive and completes the path between the first and second terminals of the switch, and where opening the switch makes it nonconductive and breaks the path between the first and second terminals of the switch. Control signals 175 also include a selector control signal that is coupled to output selector 215 at its control terminal. The selector control signal (which may include one or more control signals) is configured to select one of a number of input terminals (or nodes) and complete the path from the selected input terminal to an output terminal (or node).

Each frequency band is associated with a configuration or sequence of one or more impedance inverters selected from impedance inverters 220 and 225, also referred to as an impedance inverter configuration. An impedance inverter configuration includes either a single impedance inverter or a compound impedance inverter configuration of two or more impedance inverters coupled in series. The operating configuration (which implements a particular impedance inverter configuration) can also be characterized as including activation of a pair of amplifier gain elements 130 that are selected from among the plurality of amplifier gain elements due to the outputs of the pair of amplifier gain elements 130 being respectively coupled to end terminals of the single impedance inverter (if the operating configuration includes the single impedance inverter) or to end terminals of the compound impedance inverter (if the operating configuration includes the compound impedance inverter, such as to end terminals 235 and 140(3) of a compound impedance inverter including 220 and 225).

Each impedance inverter configuration provides a phase shift of approximately 90 degrees for signals having a frequency within the associated frequency band, where each impedance inverter configuration is tuned to approximately the center frequency of the frequency band associated with the respective impedance inverter configuration. For example, impedance inverter 220 may be tuned to the first center frequency of the first frequency band, impedance inverter 225 may be tuned to the second center frequency of the second frequency band, and the combination of impedance inverter 220 and 225 coupled in series is tuned to a third center frequency of the third frequency band. In such an example, ¼ of the wavelength of the first center frequency plus ¼ of the wavelength of the second center frequency is approximately equal to ¼ of the wavelength of the third center frequency. Each impedance inverter configuration inverts impedance most accurately at the center frequency of the associated frequency band and less accurately (but within an acceptable tolerance) for frequencies further from the center frequency within the associated frequency band. In some embodiments, the one or more impedance inverters 220 and 225 are each implemented as a quarter-wave transmission line. In other embodiments, the one or more impedance inverters each perform the function of a quarter-wave transmission line while being implemented using planar transmission lines, lumped elements (such as a pi network, T-network, or other network utilizing capacitive and inductive elements), co-axial transmission lines, or any other form of transmission line or a combination of lumped elements and planar elements.

Intermediate signal node 140(1) is coupled to a first terminal of impedance inverter 220 via node 235. A second terminal of impedance inverter 220 is coupled to a first terminal of switch 205(1), which in turn has a second terminal coupled to a first terminal of capacitor 210(1). Switch 205(1) also has a control terminal coupled to one of the control signals 175 that are provided by controller circuit 165. Capacitor 210(1) has a second terminal coupled to central node 230.

Intermediate signal node 140(2) is coupled to a first terminal of switch 205(2), which in turn has a second terminal coupled to a first terminal of capacitor 210(2). Switch 205(2) also has a control terminal coupled to one of the control signals 175 that are provided by controller circuit 165. Capacitor 210(2) has a second terminal coupled to central node 230.

Intermediate signal node 140(3) is coupled to a first terminal of impedance inverter 225. A second terminal of impedance inverter 225 is coupled to a first terminal of switch 205(3), which in turn has a second terminal coupled to a first terminal of capacitor 210(3). Switch 205(3) also has a control terminal coupled to one of the control signals 175 that are provided by controller circuit 165. Capacitor 210(3) has a second terminal coupled to central node 230.

Node 235 is coupled to a first input terminal, or node A, of output selector 215 and central node 230 is coupled to a second input terminal, or node B, of output selector 215. Output selector 215 also has an output terminal coupled to output signal node 160. Output selector 215 is configured to select one of node A and node B (or select between node 235 and node 230) and complete the path from the selected node to output signal node 160.

It is noted that other embodiments of combiner circuit 145 may not include capacitors 210(1)-(3), in which case the path switches 205(1)-(3) would be directly coupled to central node 230.

Figure 3:
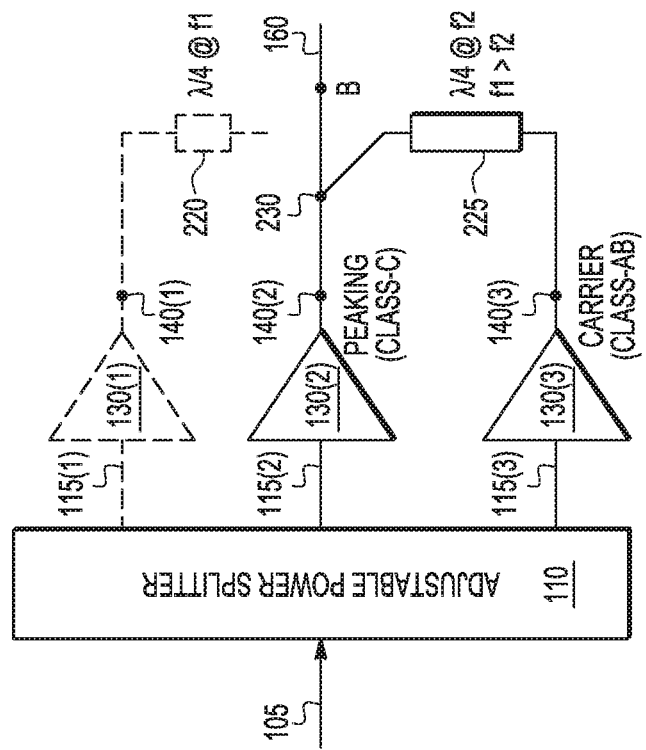
FIGS. 3-5 illustrate block diagrams depicting example operation of the multi-band Doherty amplifier device of FIG. 1 across multiple frequency bands, according to some embodiments.
Figure 4:
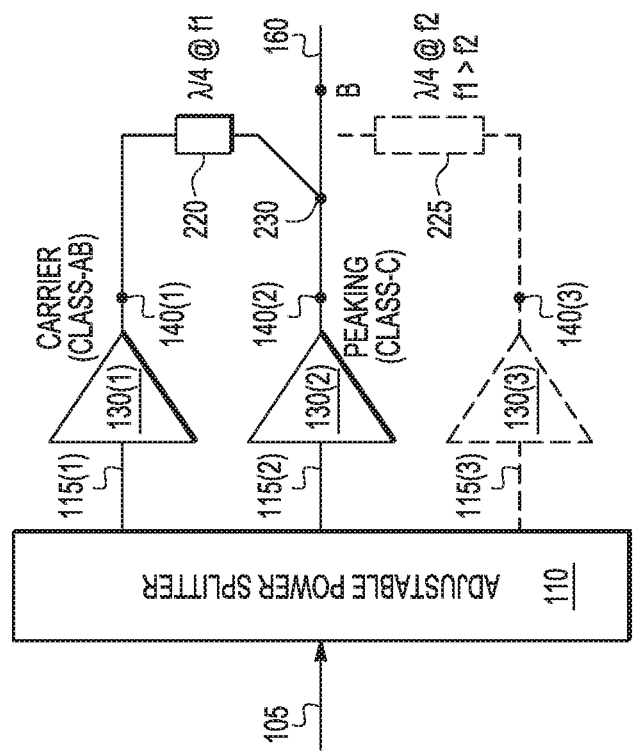
Figure 5:
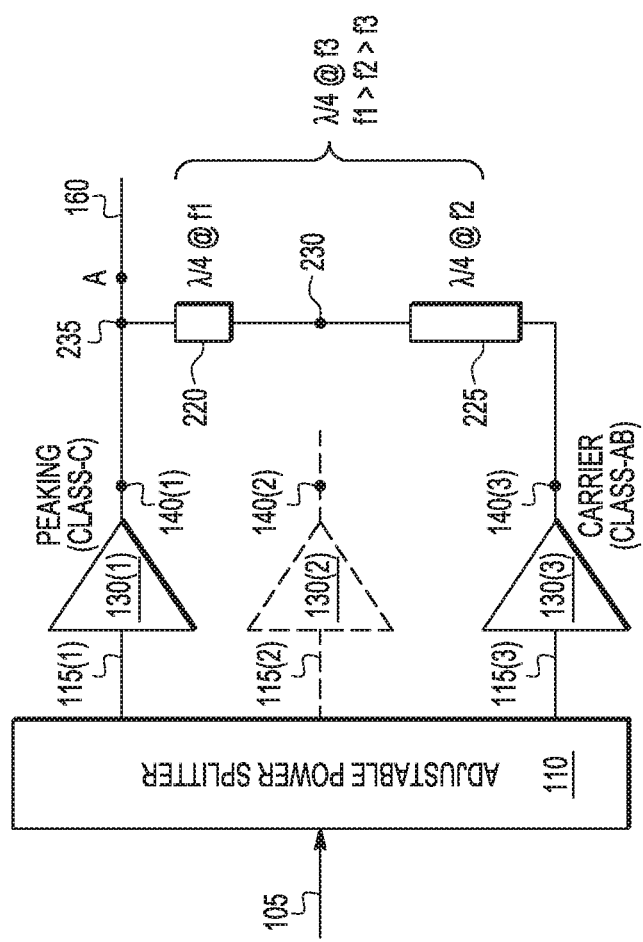
Figure 6:
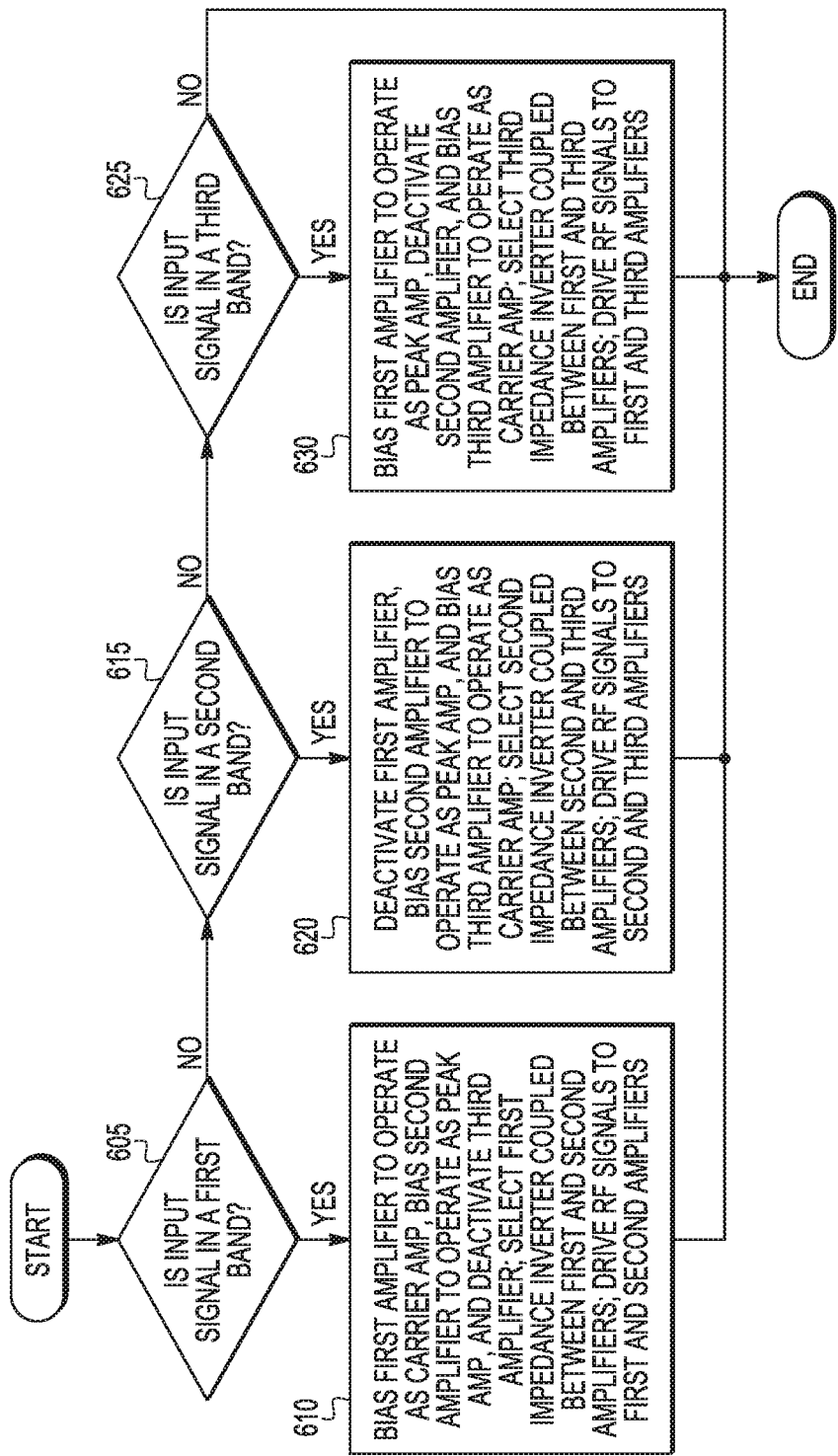
FIG. 6 illustrates a flowchart depicting an example process for operating a multi-band Doherty amplifier device like that shown in FIG. 1, according to some embodiments.

FIG. 6 illustrates a flowchart depicting an example process for operating a multi-band Doherty amplifier device like that shown in FIG. 1, which has three configurable frequency bands: a first frequency band having a first center frequency, a second frequency band having a second center frequency, and a third frequency band having a third center frequency, where the first center frequency is larger than the second center frequency, and the second center frequency is larger than the third center frequency. In some embodiments, the quarter wavelength of the first center frequency plus the quarter wavelength of the second center frequency is approximately equal to the quarter wavelength of the third center frequency. Simplified schematics of the operating configurations of device 100 are illustrated in FIGS. 3-5 and are referenced in the discussion of the process of FIG. 6, where each operating configuration is associated with a frequency band configurable on device 100. Each operating configuration is implemented by a number of settings output by controller circuit 165 (e.g., control signals to adjustable power splitter 110 and combiner circuit 145 and bias signals to amplifier gain elements 130(1)-(3)) that configure components of the device 100 to efficiently amplify input signal 105 that falls within the associated frequency band.

The process shown in FIG. 6 is implemented by controller circuit 165 in response to receipt of an input signal 105, such as from baseband and transceiver module 103 or from similar RF receiving functionality. The process begins at operation 605, where controller circuit 165 determines whether the input signal is in a first frequency band. For example, controller circuit 165 determines whether a frequency of the input signal falls between an upper frequency and a lower frequency that together define the first frequency band (e.g., the frequency of the input signal is both less than the upper frequency and is greater than the lower frequency). If the input signal falls within the first frequency band, the process continues to operation 610, where controller circuit 165 implements a first operating configuration in device 100 that is associated with the first frequency band.

FIG. 3 illustrates a first operating configuration that includes a carrier conduction path 115(1) through amplifier gain element 130(1), where controller circuit 165 outputs a bias signal to element 130(1) that configures element 130(1) to operate as a carrier amplifier (e.g., operating in Class AB mode). The first operating configuration also includes a peaking conduction path 115(2) through amplifier gain element 130(2), where controller circuit 165 outputs a bias signal to element 130(2) that configures element 130(2) to operate as a peaking amplifier (e.g., operating in Class C mode). As part of the first operating configuration, controller circuit 165 also outputs control signals to configure selection circuit 1105 of adjustable power splitter 110 to drive a main signal (based on the input signal 105) on carrier conduction path 115(1) and drive a shifted signal (based on the input signal 105) that is phase shifted from the main signal by approximately 90 degrees on the peaking conduction path 115(2). As part of the first operating configuration, controller circuit 165 also outputs a bias signal to deactivate the remaining amplifier gain element 130(3).

The first operating configuration also includes impedance inverter 220 coupled between output nodes 140(1) and 140(2), respectively, of the carrier and peaking amplifiers, where impedance inverter 220 is tuned to the first center frequency of the first frequency band. For example, switches 205(1) and 205(2) are closed (or activated) to complete the first and second conduction paths from the outputs of amplifier gain elements 130(1) and 130(2) to combine at central node 230. The control signals also deactivate switch 205(3), which remains open. The signal on the carrier conduction path experiences an approximately 90 degree phase shift as it travels through impedance inverter 220 and is combined in phase with the signal on the peaking conduction path at central node 230. The control signals output by controller circuit 165 also control selector 215 to contact node B and provide the combined signal of central node 230 at output signal node 160.

Returning to operation 605 of FIG. 6, if the input signal does not fall within the first frequency band, the process continues to operation 615, where controller circuit 165 determines whether the frequency of the input signal falls between an upper frequency and a lower frequency that together define the second frequency band (e.g., the frequency of the input signal is both less than the upper frequency and is greater than the lower frequency). If the input signal falls within the second frequency band, the process continues to operation 620, where controller circuit 165 implements a second operating configuration in device 100 that is associated with the second frequency band.

FIG. 4 illustrates a second operating configuration that includes a carrier conduction path 115(3) through amplifier gain element 130(3), where controller circuit 165 outputs a bias signal to element 130(3) that configures element 130(3) to operate as a carrier amplifier. The second operating configuration also includes a peaking conduction path 115(2) through amplifier gain element 130(2), where controller circuit 165 outputs a bias signal to element 130(2) that configures element 130(2) to operate as a peaking amplifier. As part of the second operating configuration, controller circuit 165 also outputs control signals to configure selection circuit 1105 of adjustable power splitter 110 to drive the main signal on carrier conduction path 115(3) and drive the shifted signal on peaking conduction path 115(2). As part of the second operating configuration, controller circuit 165 also outputs a bias signal to deactivate the remaining amplifier gain element 130(1).

The second operating configuration also includes impedance inverter 225 coupled between the output nodes 140(3) and 140(2), respectively, of the carrier and peaking amplifiers, where impedance inverter 225 is tuned to the second center frequency of the second frequency band. For example, switches 205(3) and 205(2) are closed (or activated) to complete the carrier and peaking conduction paths from the outputs of amplifier gain elements 130(3) and 130(2) to combine at central node 230. The control signals also deactivate switch 205(1), which remains open. The signal on the carrier conduction path experiences an approximately 90 degree phase shift as it travels through impedance inverter 225 and is combined in phase with the signal on the peaking conduction path at central node 230. The control signals output by controller circuit 165 also control selector 215 to contact node B and provide the combined signal of central node 230 at output signal node 160.

Returning to operation 615 of FIG. 6, if the input signal does not fall within the second frequency band, the process continues to operation 625, where controller circuit 165 determines whether the frequency of the input signal falls between an upper frequency and a lower frequency that together define the third frequency band (e.g., the frequency of the input signal is both less than the upper frequency and is greater than the lower frequency). If the input signal falls within the third frequency band, the process continues to operation 630, where controller circuit 165 implements a third operating configuration in device 100 that is associated with the third frequency band. If the input signal does not fall within the third frequency band, the process ends. In other embodiments, if the input signal does not fall within the third frequency band, the controller circuit 165 implements one of the three operating configurations, such as the third operating configuration, as a default operating configuration.

FIG. 5 illustrates a third operating configuration that includes a carrier conduction path 115(3) through amplifier gain element 130(3), where controller circuit 165 outputs a bias signal to element 130(3) that configures element 130(3) to operate as a carrier amplifier. The third operating configuration also includes a peaking conduction path 115(1) through amplifier gain element 130(1), where controller circuit 165 outputs a bias signal to element 130(1) that configures element 130(1) to operate as a peaking amplifier. As part of the third operating configuration, controller circuit 165 also outputs control signals to configure selection 1105 of adjustable power splitter 110 to drive the main signal on carrier conduction path 115(3) and drive the shifted signal on the peaking conduction path 115(1). As part of the third operating configuration, controller circuit 165 also outputs a bias signal to deactivate the remaining amplifier gain element 130(2).

The third operating configuration also includes a combined impedance inverter that is the combination of impedance inverters 220 and 225, which are coupled in series between the output nodes 140(3) and 140(1), respectively, of the carrier and peaking amplifiers, where the combined impedance inverter is (approximately) tuned to the third center frequency of the third frequency band. For example, switches 205(3) and 205(1) are closed (or activated) to complete the carrier and peaking conduction paths from the outputs of amplifier gain elements 130(3) and 130(1) to combine at node 235. The control signals also deactivate switch 205(2), which remains open. The signal on the carrier conduction path experiences an approximately 90 degree phase shift as it travels through the combined impedance inverter and is combined in phase with the signal on the peaking conduction path at node 235. The control signals output by controller circuit 165 also controls selector 215 to contact node A and provide the combined signal of node 235 at output signal node 160.

Table 1 below provides a number of quarter (¼) wavelengths of example center frequencies of frequency bands that may be configurable on a multi-band Doherty amplifier device like that shown in FIGS. 1 and 7, although other center frequencies may be configurable on a multi-band Doherty amplifier, as well. The example quarter wavelengths are provided for a device utilizing a substrate having a thickness on the order of 20 mil and a dielectric constant on the order of 3.6, although other embodiments may utilize a substrate having a different thickness, a different dielectric constant, or both. In some embodiments, each frequency band has an upper or ceiling frequency of approximately 30 to 35 MHz above the given center frequency and a lower or floor frequency of approximately 30 to 35 MHz below the given center frequency. The upper and lower frequencies may be defined closer to the center frequencies (e.g., approximately 20 to 30 MHz above and below, providing a narrower band) or father from the center frequencies (e.g., approximately 35 to 45 MHz above and below, providing a broader band) in other embodiments. During design of a multi-band Doherty amplifier device, a set of three or more center frequencies may be selected for implementation in the device, where one or more (lower) center frequencies of the set have a quarter wavelength approximately equal to a combination of quarter wavelengths of two or more (higher) center frequencies of the set, where the one or more lower center frequencies have a longer quarter wavelength than the two or more higher center frequencies.

TABLE 1

Frequencies and Quarter wavelengths

| Frequency (MHz) | 1/4 wavelength (mil) |
| --- | --- |
| 3555 | 498 |
| 2655 | 667 |
| 2140 | 827.8 |
| 1960 | 904 |
| 1845 | 960.3 |
| 1540 | 1150.6 |
| 960 | 1845.8 |
| 850 | 2084.6 |
| 750 | 2362.5 |

For example, a set of three center frequencies may be selected for implementation in the device based on whether their quarter wavelengths satisfy the relationship of the first center frequency's quarter wavelength plus the second center frequency's wavelength is approximately equal to the third center frequency's quarter wavelength. One set of frequencies includes f1=3555 MHz, f2=960 MHz, and f3=750 MHz, where the combination of quarter wavelengths of f1 (498 mil) and f2 (1845.8 mil) is equal to 2343.8, which is within an acceptable tolerance (e.g., within 1% difference) of the quarter wavelength of f3 (2362.8). Another set of frequencies includes f1=1960 MHZ, f2=1845 MHZ, and f3=960 MHz, where the combination of quarter wavelengths of f1 (904 mil) and f2 (960.3 mil) is equal to 1864.3, which is within an acceptable tolerance of the quarter wavelength of f3 (1845.8). Another set of frequencies includes f1=3555 MHz, f2=2655 MHz, and f3='1540 MHz, where the combination of quarter wavelengths of f1 (498 mil) and f2 (667 mil) is equal to 1165, which is within an acceptable tolerance (e.g., within 2% difference) of the quarter wavelength of f3 (1150.6).

In another embodiment, a set of six center frequencies may be selected for implementation in a multi-band Doherty amplifier device based on whether their quarter wavelengths satisfy the further relationships of the second center frequency's quarter wavelength plus the fourth center frequency's wavelength is approximately equal to the fifth center frequency's wavelength, and the third center frequency's quarter wavelength plus the fifth center frequency's wavelength is approximately equal to the sixth center frequency's wavelength.

Figure 7:
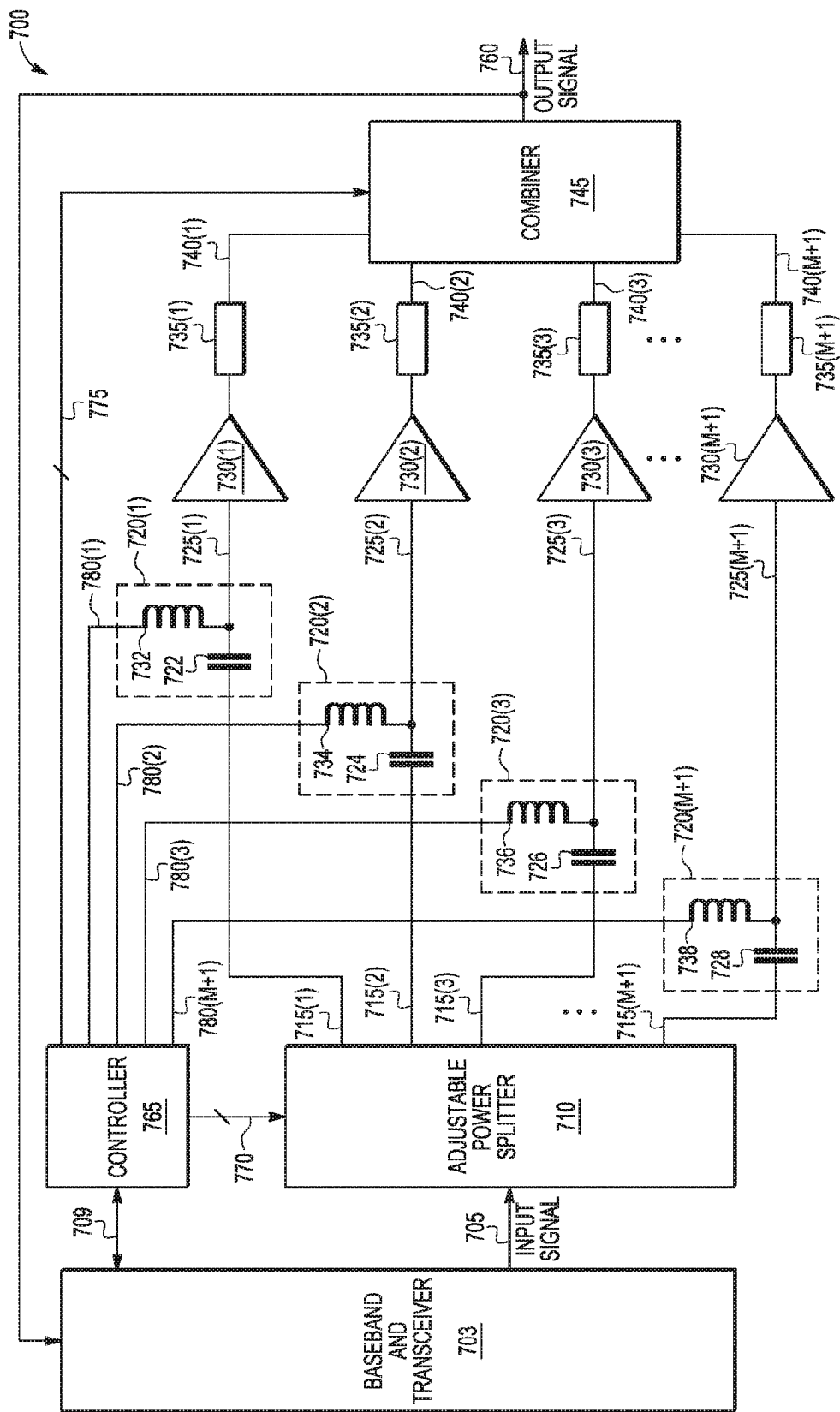
FIG. 7 illustrates a block diagram depicting another example multi-band Doherty amplifier device in which the disclosure is implemented, according to some embodiments.

FIG. 7 illustrates a block diagram depicting another example multi-band Doherty amplifier device 700 in which the disclosure is implemented. Multi-band Doherty amplifier device 700 is a radio frequency (RF) amplifier device that may be implemented as part of a transmitter, a receiver, or a transceiver, which functionality is represented by baseband and transceiver module 703. Embodiments of multi-band Doherty amplifier device 700 (or simply device 700) may include an adjustable power splitter 710, input matching networks 720(1)-(M+1), amplifier gain elements 730(1)-(M+1), output matching networks 735(1)-(M+1), a combiner circuit 745, and a controller circuit 765. The operation of each of these components are similar to their counterparts discussed above, except where noted below.

In the embodiment shown, device 700 is configured to receive an RF input signal 705 from baseband and transceiver module 703 at adjustable power splitter 710 and at controller circuit 765 on signal bus 709. Controller circuit 765 includes logic that is configured to analyze input signal 705 to determine, and automatically implement, an appropriate operating configuration for device 700. For example, in response to receipt of input signal 705, controller circuit 765 determines whether input signal 705 is characterized by a frequency that falls within one of four or more frequency bands, where device 700 has a different operating configuration associated with each band. The appropriate operating configuration configures device 700 for efficient amplification of signals within the determined frequency band.

Each operating configuration includes activation of two amplifier gain elements 730 and deactivation of the remaining amplifier gain elements. Each operating configuration also includes configuring adjustable power splitter 710 to drive appropriate RF signals to the pair of activated amplifier gain elements 730 and configuring combiner circuit 745 to select an appropriate impedance inverter configuration for the determined frequency band, where the appropriate impedance inverter configuration is coupled between outputs of the activated amplifier gain elements and tuned to a center frequency (or near a center frequency) of the determined frequency band. The appropriate impedance inverter configuration is either a selected single impedance inverter or a selected compound impedance inverter that includes two or more single impedance inverters coupled in series. The operating configuration can also be characterized as including activation of a pair of amplifier gain elements 730 that are selected from among the plurality of amplifier gain elements due to the outputs of the pair of amplifier gain elements 730 being respectively coupled to end terminals of the single impedance inverter (if the operating configuration includes the single impedance inverter) or to end terminals of the compound impedance inverter (if the operating configuration includes the compound impedance inverter, such as to end terminals 830(1) and 830(M) of a compound impedance inverter including 820(1)-(2), discussed below in connection with FIG. 8). Controller circuit 765 is also configured to output a number of control signals and bias signals (or bias circuit control signals), also referred to as a number of settings, to implement the operating configuration associated with the determined frequency band.

In embodiments discussed herein, adjustable power splitter 710 outputs a pair of signals based on input signal 705, a main signal and a shifted signal, where the pair of signals have approximately equal power and the shifted signal is phase shifted from the main signal by approximately 90 degrees. Adjustable power splitter 710 also includes a selection circuit that is configured to drive one of the pair of power splitter output signals on one of paths 715(1)-(M+1) and drive the other of the pair of power splitter output signals on another one of paths 715(1)-(M+1), according to the operating configuration implemented by controller circuit 765. The selection circuit utilized in adjustable power splitter 710 is further discussed below in connection with FIG. 11.

As discussed above, FIG. 11 illustrates a block diagram depicting an example selection circuit 1105 utilized in a multi-band Doherty amplifier device, like device 700 of FIG. 7. Selection circuit 1105 includes an N number of multiplexers 1110(1)-(N), such as four or more multiplexers 1110. Each output 1115 is coupled to a respective conduction path 715 of device 700, where output 1115(N) is coupled to path 715(M+1). Each multiplexer 1110 receives a select signal 1130 and an enable signal 1135 from controller circuit 765, also shown as control signals 770 in FIG. 7. Controller circuit 765 is configured to enable the multiplexers 1110 that are coupled to the activated amplifier gain elements 730 and select the appropriate signal to drive to the activated amplifier gain elements 730, according to the operating configuration. In the embodiments described below, controller circuit 765 is configured to drive the main signal onto the conduction path coupled to the amplifier gain element 730 configured to operate as a carrier amplifier (e.g., onto the carrier conduction path), and to drive the shifted signal onto the conduction path coupled to the amplifier gain element 730 configured to operate as a peaking amplifier (e.g., onto the peaking conduction path).

Each output of adjustable power splitter 710 (or path 715(1)-(M+1)) is coupled to a respective input matching network 720(1)-(M+1). In the embodiment shown, path 715(1) is coupled to input node 725(1) of amplifier gain element 730(1) via capacitor 722 of input matching network 720(1). Path 715(2) is coupled to input node 725(2) of amplifier gain element 730(2) via capacitor 724 of input matching network 720(2). Path 715(3) is coupled to input node 725(3) of amplifier gain element 730(3) via capacitor 726 of input matching network 720(3). Path 715(M+1) is coupled to input node 725(M+1) of amplifier gain element 730(M+1) via capacitor 728 of input matching network 720(M+1).

Controller circuit 765 is coupled to each amplifier gain element 730(1)-(M+1) by a respective bias signal line 780(1)-(M+1). Bias signal line 780(1) is coupled to input node 725(1) of amplifier gain element 730(1) via inductor 732 of input matching network 720(1). Bias signal line 780(2) is coupled to input node 725(2) of amplifier gain element 730(2) via inductor 734 of input matching network 720(2). Bias signal line 780(3) is coupled to input node 725(3) of amplifier gain element 730(3) via inductor 736 of input matching network 720(3). Bias signal line 780(M+1) is coupled to input node 725(M+1) of amplifier gain element 730(M+1) via inductor 738 of input matching network 720(M+1).

Controller circuit 765 provides bias signals to amplifier gain elements 730(1)-(M+1) according to the operating configuration implemented by controller circuit 765. Each operating configuration activates one amplifier gain element as the carrier amplifier and another amplifier gain element as the peaking amplifier, while deactivating the remaining amplifier gain elements.

In some embodiments, each amplifier gain element 730(1)-(M+1) is coupled to a respective output matching network 735(1)-(M+1), which in turn is coupled to a respective input node 740(1)-(M+1) of combiner circuit 745. In other embodiments, each amplifier gain element 730(1)-(M+1) is coupled to a respective input node 740(1)-(M+1) of combiner circuit 745.

Nodes 740(1)-(M+1) are also referred to as intermediate signal nodes 740(1)-(M+1). Since each of intermediate signal nodes 740(1)-(M+1) is coupled to a respective output of amplifier gain elements 730(1)-(M+1), intermediate signal nodes 740(1)-(M+1) may also be characterized herein as output nodes of amplifier gain elements 730(1)-(M+1). Also, since a pair of intermediate signal nodes 740 are each coupled to a respective output of a pair of activated amplifier gain elements 730 that are configured to operate as a carrier amplifier and a peaking amplifier, an intermediate signal node 740 may also be characterized herein as an output node of the carrier conduction path (when the node 740 is coupled to the output of the carrier amplifier) or an output node of the peaking conduction path (when the node 740 is coupled to the output of the peaking amplifier).

Combiner circuit 745 is configured to select an impedance inverter configuration from a number of impedance inverters within combiner circuit 745, according to the operating configuration implemented by controller circuit 765. The selected impedance inverter configuration may include a single impedance inverter or may include a compound impedance inverter configuration that includes two or more single impedance inverters coupled in series. The selected impedance inverter configuration provides a phase shift of approximately 90 degrees for signals within the determined frequency band. The selected impedance inverter configuration is coupled between the outputs of the activated amplifier gain elements in order to combine the outputs in phase, resulting in a single output signal on output signal node 760.

Combiner circuit 745 is further discussed below in connection with FIG. 8. An example process for operating device 700 is further discussed below in connection with FIG. 10, with example operating configurations of device 100 further discussed below in connection with FIG. 9.

Figure 8:
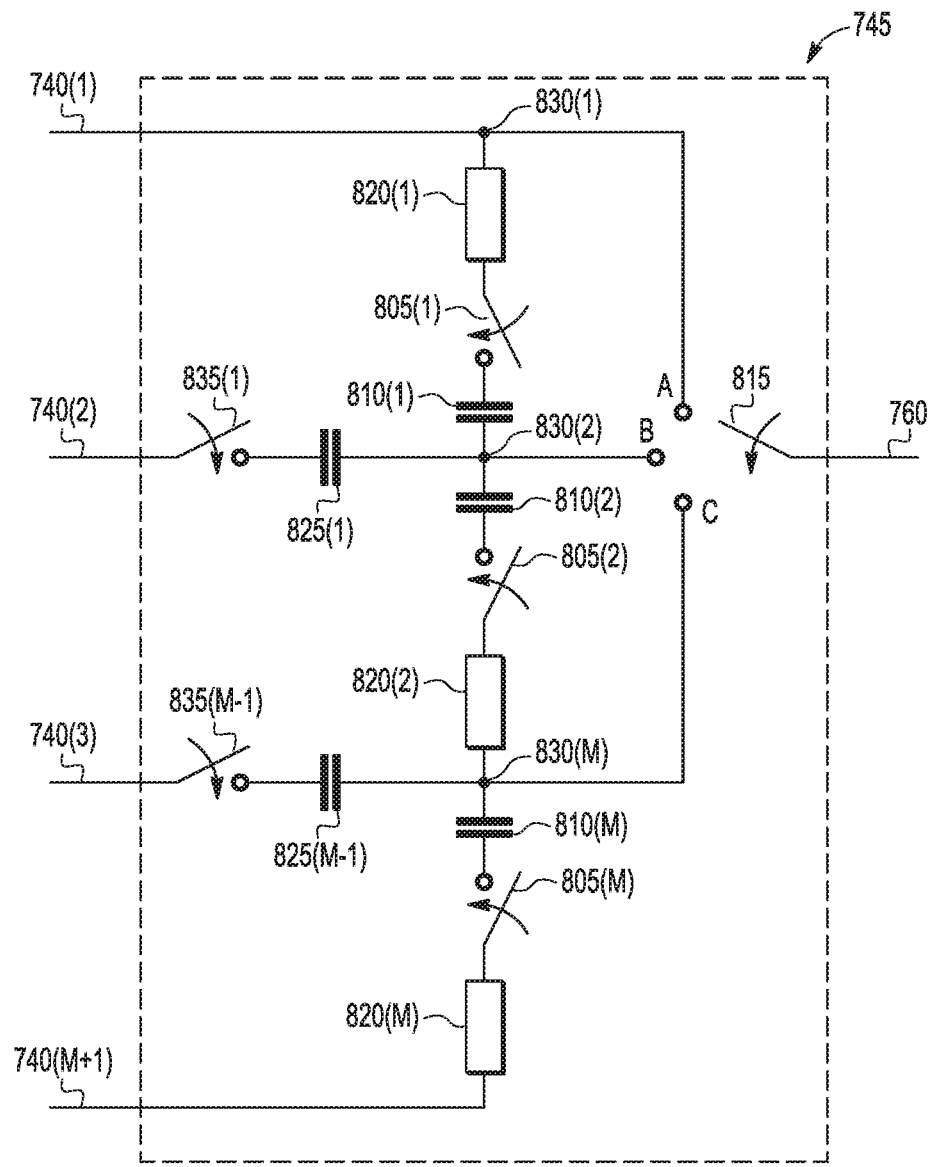
FIG. 8 illustrates a block diagram depicting an example combiner circuit utilized in the multi-band Doherty amplifier device of FIG. 7, according to some embodiments.

FIG. 8 illustrates a block diagram depicting an example combiner circuit 745 utilized in the multi-band Doherty amplifier device 700 of FIG. 7. Combiner circuit 745 includes intermediate signal nodes 740(1)-(M+1), path switches 805(1)-(M), path switches 835(1)-(M−1), capacitors 810(1)-(M), capacitors 825(1)-(M−1), output selector 815, impedance inverters 820(1)-(M), and output signal node 760. Operation of combiner circuit 745 is further discussed below in connection with FIG. 10.

In some embodiments, switches 805(1)-(M), switches 835(1)-(M−1), and selector 815 may be implemented using one or more transistors, such as n-channel or p-channel transistors, or other suitable switching devices. Control signals 775 provided by controller circuit 765 to combiner circuit 745 includes a number of switch control signals, each coupled to a respective one of switches 805(1)-(M) and switches 835(1)-(M−1) at its control terminal. The switch control signals are each configured to open or close the respective switch. Control signals 775 also include a selector control signal that is coupled to output selector 815 at its control terminal. The selector control signal (which may include one or more control signals) is configured to select one of a number of input terminals (or nodes) and complete the path from the selected input terminal to an output terminal (or node).

Each frequency band is associated with a configuration or sequence of one or more impedance inverters selected from impedance inverters 820(1)-(M), where an impedance inverter configuration includes either a single impedance inverter or a compound impedance inverter configuration of two or more impedance inverters coupled in series. Each impedance inverter configuration provides a phase shift of approximately 90 degrees for signals having a frequency within the associated frequency band, where each impedance inverter configuration is tuned to approximately the center frequency of the frequency band associated with the respective impedance inverter configuration. Each impedance inverter configuration inverts impedance most accurately at the center frequency of the associated frequency band and less accurately (but within an acceptable tolerance) for frequencies further from the center frequency within the associated frequency band. In some embodiments, the one or more impedance inverters 820(1)-(M) are each implemented as a quarter-wave transmission line. In other embodiments, the one or more impedance inverters each perform the function of a quarter-wave transmission line while being implemented using planar transmission lines, lumped elements (such as a pi network, T-network, or other network utilizing capacitive and inductive elements), co-axial transmission lines, or any other form of transmission line or a combination of lumped elements and planar elements.

Intermediate signal node 740(1) is coupled to a first terminal of impedance inverter 820(1) via node 830(1). A second terminal of impedance inverter 820(1) is coupled to a first terminal of switch 805(1), which in turn has a second terminal coupled to a first terminal of capacitor 810(1). Switch 805(1) also has a control terminal coupled to one of the control signals 775 that are provided by controller circuit 765. Capacitor 810(1) has a second terminal coupled to node 830(2).

Intermediate signal node 740(2) is coupled to a first terminal of switch 835(1), which in turn has a second terminal coupled to a first terminal of capacitor 825(1) and a control terminal coupled to one of the control signals 775 that are provided by controller circuit 765. Capacitor 825(1) has a second terminal coupled to node 830(2).

Intermediate signal node 740(3) (which may also be referred to as node 740(M)) is coupled to a first terminal of switch 835(M−1), which in turn has a second terminal coupled to a first terminal of capacitor 825(M−1) and a control terminal coupled to one of the control signals 775 that are provided by controller circuit 765. Capacitor 825(M−1) has a second terminal coupled to node 830(M), which in turn is coupled to a first terminal of impedance inverter 820(2) (which may also be referred to as inverter 820(M−1)). A second terminal of impedance inverter 820(2) is coupled to switch 805(2), which in turn has a second terminal coupled to a first terminal of capacitor 810(2) and a control terminal coupled to one of the control signals 775 that are provided by controller circuit 765. Capacitor 810(2) has a second terminal coupled to node 830(2).

Intermediate signal node 740(M+1) is coupled to a first terminal of impedance inverter 820(M). A second terminal of impedance inverter 820(M) is coupled to a first terminal of switch 805(M), which in turn has a second terminal coupled to a first terminal of capacitor 810(M) and a control terminal coupled to one of the control signals 775 that are provided by controller circuit 765. Capacitor 810(M) has a second terminal coupled to central node 230.

Node 830(1) is coupled to a first input terminal, or node A, of output selector 815, node 830(2) is coupled to a second input terminal, or node B, of output selector 815, and node 830(M) is coupled to an Mth input terminal, or node C, of output selector 815. Output selector 815 also has an output terminal coupled to output signal node 760. Output selector 815 is configured to select one of its M nodes (or select a node from among nodes 830(1)-(M)) and complete the path from the selected node to output signal node 760.

It is noted that other embodiments of combiner circuit 745 may not include capacitors 810(1)-(M) and 825(1)-(M−1), in which case the path switches 805(1)-(M) and 835(1)-(M−1) would be directly coupled to respective nodes 830(1)-(M).

Figure 10:
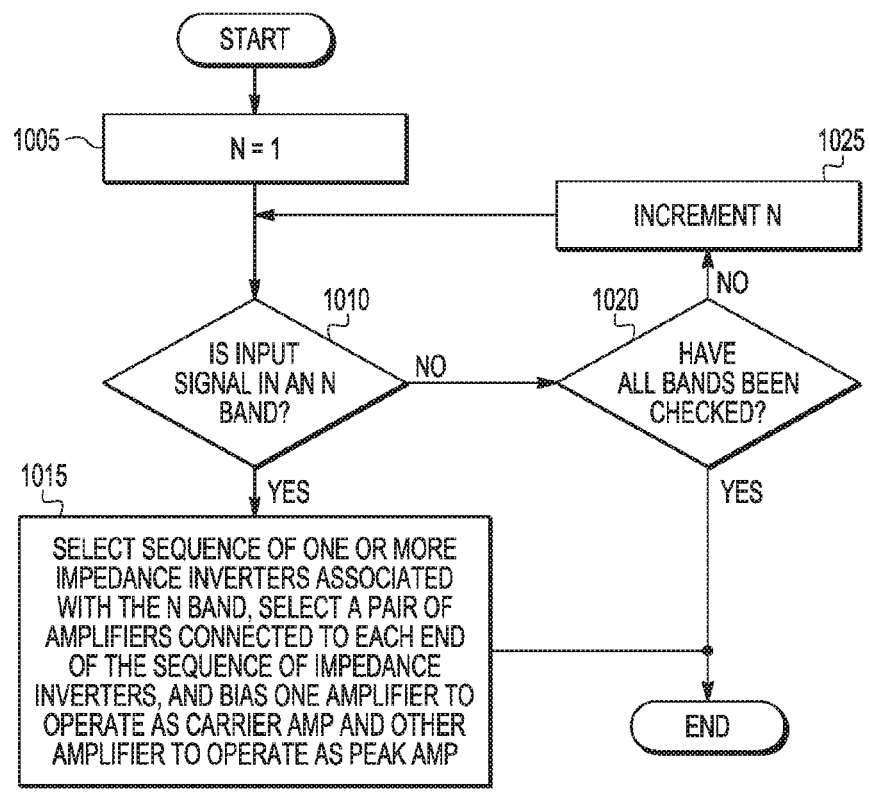
FIG. 10 illustrates a block diagram depicting an example process for operating a multi-band Doherty amplifier device like that shown in FIG. 7, according to some embodiments.

FIG. 10 illustrates a flowchart depicting an example process for operating a multi-band Doherty amplifier device like that shown in FIG. 7, which implements four or more frequency bands. In some embodiments, the process shown in FIG. 10 is implemented by controller circuit 765 in response to receipt of an input signal 705, such as from baseband and transceiver module 703 or from similar RF receiving functionality.

The process begins at operation 1005, where controller circuit 765 determines initializes a counter variable N to 1, where N frequency bands are configurable on device 700. The process continues to operation 1010, where controller circuit 765 determines whether the input signal is in an Nth frequency band. For example, controller circuit 765 determines whether a frequency of the input signal falls between an upper frequency and a lower frequency that together define the first Nth band (e.g., the frequency of the input signal is both less than the upper frequency and is greater than the lower frequency). If the input signal falls within the Nth frequency band, the process continues to operation 1015, where controller circuit 765 implements an Nth operating configuration in device 700 that is associated with the Nth frequency band.

Figure 9:
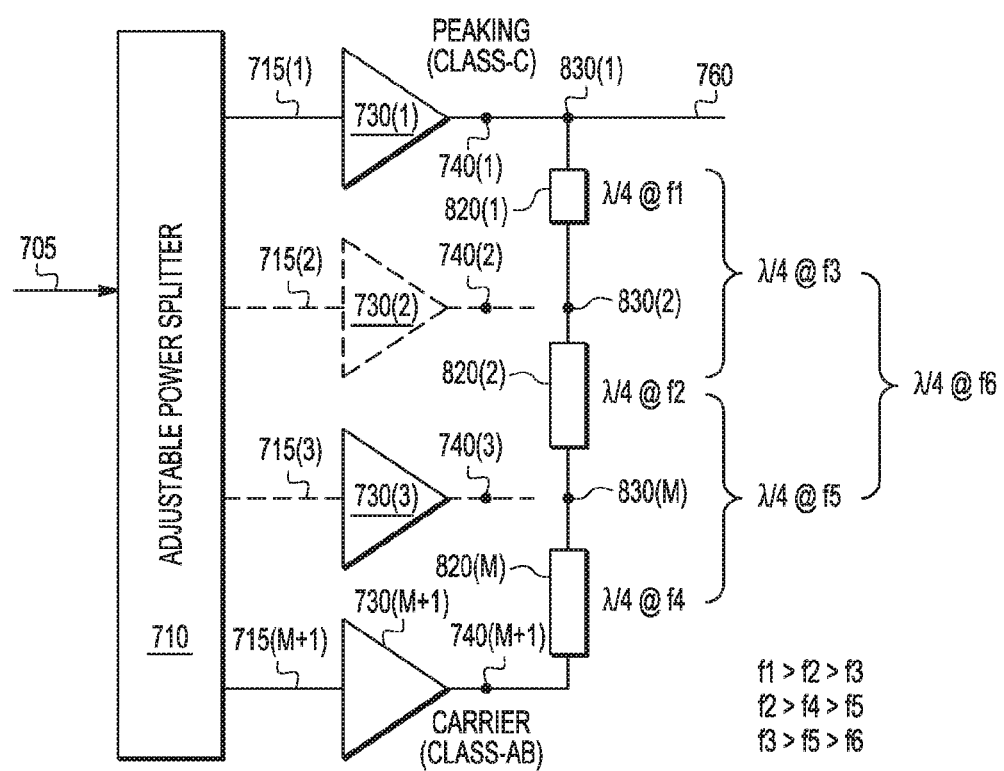
FIG. 9 illustrates a block diagram depicting example operation of the multi-band Doherty amplifier device of FIG. 7 across multiple frequency bands, according to some embodiments.

A simplified schematic of operating configurations implemented in an example embodiment of device 700 having N configurable frequency bands is illustrated in FIG. 9, where six frequency bands are implemented (e.g., N=6), each having a respective center frequency, where the first center frequency is larger than the second center frequency, which in turn is larger than the third center frequency. In such an example, the second center frequency is larger than the fourth center frequency, which in turn is larger than the fifth center frequency. Continuing the example, the third center frequency is larger than the fifth center frequency, which in turn is larger than the sixth frequency.

In the example embodiment shown in FIG. 9, impedance inverter 820(1) is tuned to the first center frequency of the first frequency band, impedance inverter 820(2) is tuned to the second center frequency of the second frequency band, and the combination of impedance inverter 820(1) and 820(2) coupled in series is tuned to a third center frequency of the third frequency band. In such an example, ¼ of the wavelength of the first center frequency plus ¼ of the wavelength of the second center frequency is approximately ¼ of the wavelength of the third center frequency. Carrying on the example, impedance inverter 820(M) is tuned to a fourth center frequency of a fourth frequency band, the combination of impedance inverter 820(2) and 820(M) coupled in series is tuned to a fifth center frequency of a fifth frequency band, and the combination of impedance inverter 820(1), 820(2), and 820(M) coupled in series is tuned to a sixth center frequency of a sixth frequency band. In such an example, ¼ of the wavelength of the first center frequency plus ¼ of the wavelength of the second center frequency is approximately equal to ¼ of the wavelength of the third center frequency. Similarly, ¼ of the wavelength of the second center frequency plus ¼ of the wavelength of the fourth center frequency is approximately equal to ¼ of the wavelength of the fifth center frequency, and ¼ of the wavelength of the third center frequency plus ¼ of the wavelength of the fifth center frequency is approximately equal to ¼ of the wavelength of the sixth center frequency.

A first operating configuration includes a carrier conduction path 715(1) through amplifier gain element 730(1)

configured as a carrier amplifier, a peaking conduction path 715(2) through amplifier gain element 730(2) configured as a peaking amplifier, and impedance inverter 820(1) that is coupled between the output nodes 740(1) and 740(2) of the carrier and peaking conduction paths 715(1) and 715(2) by closing switches 805(1) and 835(1). The remaining switches not included in paths 715(1) and 715(2) remain open. Output selector 815 is controlled to contact node B to provide the combined signal of node 830(2) at output signal node 160.

A second operating configuration includes a carrier conduction path 715(3) through amplifier gain element 730(3) configured as a carrier amplifier, a peaking conduction path 715(2) through amplifier gain element 730(2) configured as a peaking amplifier, and impedance inverter 820(2) that is coupled between the output nodes 740(3) and 740(2) of the carrier and peaking conduction paths 715(3) and 715(2) by closing switches 805(2), 835(1), and 835(M−1). The remaining switches not included in paths 715(3) and 715(2) remain open. Output selector 815 is controlled to contact node B to provide the combined signal of node 830(2) at output signal node 160.

A third operating configuration includes a carrier conduction path 715(3) through amplifier gain element 730(3) configured as a carrier amplifier, a peaking conduction path 715(1) through amplifier gain element 730(1) configured as a peaking amplifier, and impedance inverter 820(1) and 820(2) that are coupled in series between the output nodes 740(3) and 740(1) of the carrier and peaking conduction paths 715(3) and 715(1) by closing switches 805(1), 805(2), and 835(M−1). The remaining switches not included in paths 715(3) and 715(1) remain open. Output selector 815 is controlled to contact node A to provide the combined signal of node 830(1) at output signal node 160.

A fourth operating configuration includes a carrier conduction path 715(M+1) through amplifier gain element 730(M+1) configured as a carrier amplifier, a peaking conduction path 715(3) through amplifier gain element 730(3) configured as a peaking amplifier, and impedance inverter 820(M) that is coupled between the output nodes 740(M+1) and 740(3) of the carrier and peaking conduction paths 715(M+1) and 715(3) by closing switches 805(M) and 835(M−1). The remaining switches not included in paths 715(M+1) and 715(3) remain open. Output selector 815 is controlled to contact node C to provide the combined signal of node 830(M) at output signal node 160.

A fifth operating configuration includes a carrier conduction path 715(M+1) through amplifier gain element 730(M+1) configured as a carrier amplifier, a peaking conduction path 715(2) through amplifier gain element 730(2) configured as a peaking amplifier, and impedance inverters 820(2) and 820(M) that are coupled in series between the output nodes 740(M+1) and 740(2) of the carrier and peaking conduction paths 715(M+1) and 715(2) by closing switches 805(2), 805(M), and 835(1). The remaining switches not included in paths 715(M+1) and 715(2) remain open. Output selector 815 is controlled to contact node B to provide the combined signal of node 830(2) at output signal node 160.

A sixth operating configuration includes a carrier conduction path 715(M+1) through amplifier gain element 730(M+1) configured as a carrier amplifier, a peaking conduction path 715(1) through amplifier gain element 730(1) configured as a peaking amplifier, and impedance inverters 820(1), 820(2), and 820(M) that are coupled in series between the output nodes 740(M+1) and 740(1) of the carrier and peaking conduction paths 715(M+1) and 715(1) by closing switches 805(1), 805(2), and 805(M). The remaining switches not included in paths 715(M+1) and 715(1) remain open. Output selector 815 is controlled to contact node A to provide the combined signal of node 830(1) at output signal node 160.

Returning to operation of 1010 of FIG. 10, if the input signal does not fall within the present Nth frequency band, the process continues to operation 1020, where controller circuit 765 determines whether all frequency bands have been checked. For example, controller circuit 765 determines whether counter N has reached a maximum value equivalent to the number of frequency bands configurable on device 700. If counter N has not reached its maximum value, the process continues to operation 1025, where N is incremented, and returns to operation 1010 to determine whether the input signal falls within a next Nth frequency band. Returning to operation 1020, if counter N has reached its maximum value, the process ends. In other embodiments, if the input signal does not fall within the final Nth (N having its maximum value) frequency band, the controller circuit 765 implements one of the N operating configurations as a default operating configuration, such as the operating configuration associated with the largest or smallest center frequency or the operating configuration associated with the center frequency closest to the frequency of the input signal.

By now it should be appreciated that there has been provided a Doherty amplifier device that is operable over multiple frequency bands (also referred to herein as a multi-band Doherty amplifier device), where each frequency band is associated with an operating configuration for the multi-band Doherty amplifier device, which can be automatically implemented in the multi-band Doherty amplifier device upon determination of the frequency band in which the input signal frequency falls.

In one embodiment of the present disclosure, a Doherty amplifier device is provided, the device including a plurality of amplifiers; a combiner circuit including a plurality of impedance inverters and a plurality of switches coupled between the plurality of impedance inverters and outputs of the plurality of amplifiers; and a controller circuit coupled to the plurality of amplifiers and to the combiner circuit. The controller circuit is configured to output a carrier bias signal to a first amplifier of the plurality of amplifiers and a peaking bias signal to a second amplifier of the plurality of amplifier as part of a first operating configuration of a plurality of operating configurations that are configurable on the device, the first operating configuration associated with a first frequency band, and output the peaking bias signal to the second amplifier and the carrier bias signal to a third amplifier of the plurality of amplifiers as part of a second operating configuration, the second operating configuration associated with a second frequency band, where the carrier bias signal is configured to place a receiving amplifier of the plurality of amplifiers in a carrier mode and the peaking bias signal is configured to place a receiving amplifier of the plurality of amplifiers in a peaking mode.

One aspect of the above embodiment provides that the device also includes: an adjustable power splitter circuit coupled to inputs of the plurality of amplifiers, the adjustable power splitter circuit configured to: drive a main signal to one of the plurality of amplifiers that is configured to operate in the carrier mode, and drive a shifted signal to another one of the plurality of amplifiers that is configured to operate in the peaking mode.

A further aspect of the above embodiment provides that the main signal and the shifted signal are phase shifted from one another by approximately 90 degrees.

Another aspect of the above embodiment provides that the controller circuit is further configured to: select a first impedance inverter coupled between outputs of the first amplifier and the second amplifier as part of the first operating configuration, where the first impedance inverter is tuned to a first center frequency of the first frequency band, and an output signal from the second amplifier is combined in phase with an output signal from the first impedance inverter; and select a second impedance inverter coupled between outputs of the second amplifier and the third amplifier as part of the second operating configuration, where the second impedance inverter is tuned to a second center frequency of the second frequency band, and an output signal from the second amplifier is combined in phase with an output signal from the second impedance inverter.

Another aspect of the above embodiment provides that the controller circuit is further configured to: output the peaking bias signal to the first amplifier and the carrier bias signal to the third amplifier as part of a third operating configuration, the third operating configuration associated with a third frequency band.

A further aspect of the above embodiment provides that the controller circuit is further configured to: select a compound impedance inverter including a first impedance inverter and a second impedance inverter coupled in series as part of the third operating configuration, where the compound impedance inverter is coupled between outputs of the first amplifier and the third amplifier, and an output signal from the first amplifier is combined in phase with an output signal from the compound impedance inverter.

A further aspect of the above embodiment provides that the first impedance inverter is tuned to a first center frequency having a first wavelength, the second impedance inverter is tuned to a second center frequency having a second wavelength, the compound impedance inverter is approximately tuned to a third center frequency having a third wavelength, and a quarter of the third wavelength is approximately equal to a sum of a quarter of the first wavelength plus a quarter of the second wavelength.

Another aspect of the above embodiment provides that the controller circuit is further configured to: receive an input signal, determine that the input signal falls within a particular frequency band, and implement one of the plurality of operating configurations that is associated with the particular frequency band.

Another aspect of the above embodiment provides that the device also includes a plurality of input matching networks, each coupled to an input of a respective one of the plurality of amplifiers; and a plurality of output matching networks, each coupled to an output of a respective one of the plurality of amplifiers, where each respective one of the plurality of amplifiers is configurable to operate over two or more different frequency bands, and each input and output matching network coupled to the respective one of the plurality of amplifiers is configurable to operate over the two or more different frequency bands.

In another embodiment of the present disclosure, a Doherty amplifier device is provided, the device including a plurality of amplifiers; a combiner circuit including a plurality of impedance inverters and a plurality of switches coupled between the plurality of impedance inverters and outputs of the plurality of amplifiers; and a controller circuit coupled to the plurality of amplifiers and to the combiner circuit. The controller circuit is configured to: select an impedance inverter configuration of a plurality of impedance inverter configurations configurable in the combiner circuit, where each impedance inverter configuration is associated with a respective frequency band, at least one impedance inverter configuration includes a compound impedance inverter including two or more impedance inverters coupled in series, the compound impedance inverter coupled between an output of a carrier conduction path that includes a first amplifier of the plurality of amplifiers, and an output of a peaking conduction path that includes a second amplifier of the plurality of amplifiers, at least one node between the two or more impedance inverters is coupled to an output of a third amplifier of the plurality of amplifiers, and the combiner circuit is further configured to combine signals from the carrier and peaking conduction paths in phase according to the impedance inverter configuration to produce an output signal.

One aspect of the above embodiment provides that the compound impedance inverter is approximately tuned to a first center frequency having a first wavelength, each of the two or more impedance inverters is approximately tuned to a respective one of two or more center frequencies, each of the two or more respective center frequencies having a respective wavelength, and a quarter wavelength of the first center frequency is approximately equal to the sum of each quarter wavelength of the two or more respective center frequencies.

Another aspect of the above embodiment provides that the controller circuit is further configured to: receive an input signal, and determine that the input signal falls within a particular frequency band, where the particular frequency band is associated with a particular impedance inverter configuration.

A further aspect of the above embodiment provides that the particular impedance inverter configuration includes either a selected single impedance inverter or a selected compound impedance inverter, the first and second amplifiers are selected from the plurality of amplifiers due to outputs of the first and second amplifiers being respectively coupled to end terminals of the selected single impedance inverter or the selected compound impedance inverter, and the controller circuit is further configured to: output a carrier bias signal that configures the first amplifier to operate in the carrier mode, output a peaking bias signal that configures the second amplifier to operate in the peaking mode.

Another aspect of the above embodiment provides that the device also includes an adjustable power splitter circuit coupled to inputs of the plurality of amplifiers, where the adjustable power splitter circuit is configured to: drive a main signal to one of the plurality of amplifiers that is configured to operate in the carrier mode, and drive a shifted signal to another one of the plurality of amplifiers that is configured to operate in the peaking mode.

Another aspect of the above embodiment provides that the device also includes a plurality of input matching networks, each coupled to an input of a respective one of the plurality of amplifiers; and a plurality of output matching networks, each coupled between an output of a respective one of the plurality of amplifiers and the combiner circuit, where each respective one of the plurality of amplifiers is configurable to operate over two or more different frequency bands, and each input and output matching network coupled to the respective one of the plurality of amplifiers is configurable to operate over the two or more different frequency bands.

In another embodiment of the present disclosure, a method for operating a Doherty amplifier device that includes a plurality of amplifiers is provided, the method including selecting an impedance inverter configuration of a plurality of impedance inverter configurations configurable in a combiner circuit of the device, where the combiner circuit includes a plurality of impedance inverters and a plurality of switches coupled between the plurality of impedance inverters and outputs of the plurality of amplifiers, each impedance inverter configuration is associated with a respective frequency band, at least one impedance inverter configuration includes a compound impedance inverter including two or more impedance inverters coupled in series, the compound impedance inverter coupled between an output of a carrier conduction path that includes a first amplifier of the device, and an output of a peaking conduction path that includes a second amplifier of the device, at least one node between the two or more impedance inverters is coupled to an output of a third amplifier of the plurality of amplifiers, and the combiner circuit is further configured to combine signals of the carrier and peaking conduction paths in phase according to the impedance inverter configuration to produce an output signal.

One aspect of the above embodiment provides that the compound impedance inverter is approximately tuned to a first center frequency having a first wavelength, each of the two or more impedance inverters is approximately tuned to a respective one of two or more center frequencies, each of the two or more respective center frequencies having a respective wavelength, and a quarter wavelength of the first center frequency is approximately equal to the sum of each quarter wavelength of the two or more respective center frequencies.

Another aspect of the above embodiment provides that the method also includes receiving an input signal, and determining that the input signal falls within a particular frequency band, where the particular frequency band is associated with a particular impedance inverter configuration, and the particular impedance inverter configuration includes either a selected single impedance inverter or a selected compound impedance inverter.

A further aspect of the above embodiment provides that the method also includes selecting the first amplifier from the plurality of amplifiers for activation, where an output of the first amplifier is coupled to a first end terminal of the selected single impedance inverter or the selected compound impedance inverter; selecting the second amplifier from the plurality of amplifiers for activation, where an output of the second amplifier is coupled to a second end terminal of the selected single impedance inverter or the selected compound impedance inverter; and deactivating remaining ones of the plurality of amplifiers.

Another aspect of the above embodiment provides that the method also includes outputting a carrier bias signal to configure the first amplifier to operate in a carrier mode and outputting a control signal to configure an adjustable power splitter to drive a main signal to the first amplifier; outputting a peaking bias signal to configure the second amplifier to operate in a peaking mode and outputting a control signal to configure the adjustable power splitter to drive a shifted signal to the second amplifier.

The circuitry described herein may be implemented on a semiconductor substrate, which can be any semiconductor material or combinations of materials, such as gallium arsenide, silicon germanium, silicon-on-insulator (SOI), silicon, monocrystalline silicon, the like, and combinations of the above. In some embodiments, the circuitry described herein may be implemented on a single integrated circuit or within a same device. In other embodiments, the circuitry described herein may be implemented on any number of separate integrated circuits or separate devices interconnected with each other.

As used herein, the term "bus" is used to refer to a plurality of signals or conductors which may be used to transfer one or more various types of information, such as data, addresses, control, or status. The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

The terms "assert" or "set" and "negate" (or "dessert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or an asterix (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

As used herein the terms "substantial" and "substantially" mean sufficient to accomplish the stated purpose in a practical manner and that minor imperfections, if any, are not significant for the stated purpose. Also as used herein, the terms "approximately" and "about" mean a value close to or within an acceptable range of an indicated value, amount, or quality, which also includes the exact indicated value itself.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A Doherty amplifier device, the device comprising:
   a plurality of amplifiers;
   a combiner circuit comprising a plurality of impedance inverters and a plurality of switches coupled between the plurality of impedance inverters and outputs of the plurality of amplifiers; and
   a controller circuit coupled to the plurality of amplifiers and to the combiner circuit, the controller circuit configured to:
      output a carrier bias signal to a first amplifier of the plurality of amplifiers and a peaking bias signal to a second amplifier of the plurality of amplifier as part of a first operating configuration of a plurality of operating configurations that are configurable on the device, the first operating configuration associated with a first frequency band, and
      output the peaking bias signal to the second amplifier and the carrier bias signal to a third amplifier of the plurality of amplifiers as part of a second operating configuration, the second operating configuration associated with a second frequency band, wherein
         the carrier bias signal is configured to place a receiving amplifier of the plurality of amplifiers in a carrier mode and the peaking bias signal is configured to place a receiving amplifier of the plurality of amplifiers in a peaking mode.

2. The device of claim 1, further comprising:
   an adjustable power splitter circuit coupled to inputs of the plurality of amplifiers, the adjustable power splitter circuit configured to:
      drive a main signal to one of the plurality of amplifiers that is configured to operate in the carrier mode, and
      drive a shifted signal to another one of the plurality of amplifiers that is configured to operate in the peaking mode.

3. The device of claim 2, wherein the main signal and the shifted signal are phase shifted from one another by approximately 90 degrees.

4. The device of claim 1, wherein
   the controller circuit is further configured to:
      select a first impedance inverter coupled between outputs of the first amplifier and the second amplifier as part of the first operating configuration, wherein
         the first impedance inverter is tuned to a first center frequency of the first frequency band, and
         an output signal from the second amplifier is combined in phase with an output signal from the first impedance inverter; and
      select a second impedance inverter coupled between outputs of the second amplifier and the third amplifier as part of the second operating configuration, wherein
         the second impedance inverter is tuned to a second center frequency of the second frequency band, and
         an output signal from the second amplifier is combined in phase with an output signal from the second impedance inverter.

5. The device of claim 1, wherein
   the controller circuit is further configured to:
      output the peaking bias signal to the first amplifier and the carrier bias signal to the third amplifier as part of a third operating configuration, the third operating configuration associated with a third frequency band.

6. The device of claim 5, wherein
   the controller circuit is further configured to:
      select a compound impedance inverter comprising a first impedance inverter and a second impedance inverter coupled in series as part of the third operating configuration, wherein
         the compound impedance inverter is coupled between outputs of the first amplifier and the third amplifier, and
         an output signal from the first amplifier is combined in phase with an output signal from the compound impedance inverter.

7. The device of claim 6, wherein
   the first impedance inverter is tuned to a first center frequency having a first wavelength,
   the second impedance inverter is tuned to a second center frequency having a second wavelength,
   the compound impedance inverter is approximately tuned to a third center frequency having a third wavelength, and
   a quarter of the third wavelength is approximately equal to a sum of a quarter of the first wavelength plus a quarter of the second wavelength.

8. The device of claim 1, wherein
   the controller circuit is further configured to:
      receive an input signal,
      determine that the input signal falls within a particular frequency band, and
      implement one of the plurality of operating configurations that is associated with the particular frequency band.

9. The device of claim 1, further comprising:
   a plurality of input matching networks, each coupled to an input of a respective one of the plurality of amplifiers; and
   a plurality of output matching networks, each coupled to an output of a respective one of the plurality of amplifiers, wherein
      each respective one of the plurality of amplifiers is configurable to operate over two or more different frequency bands, and each input and output matching network coupled to the respective one of the plurality of amplifiers is configurable to operate over the two or more different frequency bands.

10. A Doherty amplifier device, the device comprising:
a plurality of amplifiers;
a combiner circuit comprising a plurality of impedance inverters and a plurality of switches coupled between the plurality of impedance inverters and outputs of the plurality of amplifiers; and
a controller circuit coupled to the plurality of amplifiers and to the combiner circuit, the controller circuit configured to:
select an impedance inverter configuration of a plurality of impedance inverter configurations configurable in the combiner circuit, wherein
each impedance inverter configuration is associated with a respective frequency band,
at least one impedance inverter configuration comprises a compound impedance inverter comprising two or more impedance inverters coupled in series, the compound impedance inverter coupled between
an output of a carrier conduction path that includes a first amplifier of the plurality of amplifiers, and
an output of a peaking conduction path that includes a second amplifier of the plurality of amplifiers,
at least one node between the two or more impedance inverters is coupled to an output of a third amplifier of the plurality of amplifiers, and
the combiner circuit is further configured to combine signals from the carrier and peaking conduction paths in phase according to the impedance inverter configuration to produce an output signal.

11. The device of claim 10, wherein
the compound impedance inverter is approximately tuned to a first center frequency having a first wavelength,
each of the two or more impedance inverters is approximately tuned to a respective one of two or more center frequencies, each of the two or more respective center frequencies having a respective wavelength, and
a quarter wavelength of the first center frequency is approximately equal to the sum of each quarter wavelength of the two or more respective center frequencies.

12. The device of claim 10, wherein
the controller circuit is further configured to:
receive an input signal, and
determine that the input signal falls within a particular frequency band, wherein
the particular frequency band is associated with a particular impedance inverter configuration.

13. The device of claim 12, wherein
the particular impedance inverter configuration comprises either a selected single impedance inverter or a selected compound impedance inverter,
the first and second amplifiers are selected from the plurality of amplifiers due to outputs of the first and second amplifiers being respectively coupled to end terminals of the selected single impedance inverter or the selected compound impedance inverter, and
the controller circuit is further configured to:
output a carrier bias signal that configures the first amplifier to operate in the carrier mode,
output a peaking bias signal that configures the second amplifier to operate in the peaking mode.

14. The device of claim 10, further comprising:
an adjustable power splitter circuit coupled to inputs of the plurality of amplifiers, wherein the adjustable power splitter circuit is configured to:
drive a main signal to one of the plurality of amplifiers that is configured to operate in the carrier mode, and
drive a shifted signal to another one of the plurality of amplifiers that is configured to operate in the peaking mode.

15. The device of claim 10, further comprising:
a plurality of input matching networks, each coupled to an input of a respective one of the plurality of amplifiers; and
a plurality of output matching networks, each coupled between an output of a respective one of the plurality of amplifiers and the combiner circuit, wherein
each respective one of the plurality of amplifiers is configurable to operate over two or more different frequency bands, and
each input and output matching network coupled to the respective one of the plurality of amplifiers is configurable to operate over the two or more different frequency bands.

16. A method for operating a Doherty amplifier device that includes a plurality of amplifiers, the method comprising:
selecting an impedance inverter configuration of a plurality of impedance inverter configurations configurable in a combiner circuit of the device, wherein
the combiner circuit comprises a plurality of impedance inverters and a plurality of switches coupled between the plurality of impedance inverters and outputs of the plurality of amplifiers,
each impedance inverter configuration is associated with a respective frequency band,
at least one impedance inverter configuration comprises a compound impedance inverter comprising two or more impedance inverters coupled in series, the compound impedance inverter coupled between
an output of a carrier conduction path that includes a first amplifier of the device, and
an output of a peaking conduction path that includes a second amplifier of the device,
at least one node between the two or more impedance inverters is coupled to an output of a third amplifier of the plurality of amplifiers, and
the combiner circuit is further configured to combine signals of the carrier and peaking conduction paths in phase according to the impedance inverter configuration to produce an output signal.

17. The method of claim 16, wherein
the compound impedance inverter is approximately tuned to a first center frequency having a first wavelength,
each of the two or more impedance inverters is approximately tuned to a respective one of two or more center frequencies, each of the two or more respective center frequencies having a respective wavelength, and
a quarter wavelength of the first center frequency is approximately equal to the sum of each quarter wavelength of the two or more respective center frequencies.

18. The method of claim 16, further comprising:
receiving an input signal, and
determining that the input signal falls within a particular frequency band, wherein
the particular frequency band is associated with a particular impedance inverter configuration, and the particular impedance inverter configuration comprises either a selected single impedance inverter or a selected compound impedance inverter.

19. The device of claim 18, further comprising:

selecting the first amplifier from the plurality of amplifiers for activation, wherein an output of the first amplifier is coupled to a first end terminal of the selected single impedance inverter or the selected compound impedance inverter;

selecting the second amplifier from the plurality of amplifiers for activation, wherein an output of the second amplifier is coupled to a second end terminal of the selected single impedance inverter or the selected compound impedance inverter; and deactivating remaining ones of the plurality of amplifiers.

20. The device of claim 16, further comprising:

outputting a carrier bias signal to configure the first amplifier to operate in a carrier mode and outputting a control signal to configure an adjustable power splitter to drive a main signal to the first amplifier;

outputting a peaking bias signal to configure the second amplifier to operate in a peaking mode and outputting a control signal to configure the adjustable power splitter to drive a shifted signal to the second amplifier.

* * * * *